US010516845B2

(12) United States Patent
Sargent et al.

(10) Patent No.: US 10,516,845 B2
(45) Date of Patent: Dec. 24, 2019

(54) SENSORS AND SYSTEMS FOR THE CAPTURE OF SCENES AND EVENTS IN SPACE AND TIME

(71) Applicant: InVisage Technologies, Inc., Newark, CA (US)

(72) Inventors: Edward Hartley Sargent, Toronto (CA); Jess Jan Young Lee, Woodside, CA (US); Hui Tian, Cupertino, CA (US); Emanuele Mandelli, Mountain View, CA (US)

(73) Assignee: INVISAGE TECHNOLOGIES, INC., Neward, CA (US)

( * ) Notice: Subject to any disclaimer, the term of this patent is extended or adjusted under 35 U.S.C. 154(b) by 0 days.

(21) Appl. No.: 15/939,323

(22) Filed: Mar. 29, 2018

(65) Prior Publication Data
US 2018/0220097 A1 Aug. 2, 2018

Related U.S. Application Data

(62) Division of application No. 14/732,314, filed on Jun. 5, 2015, now Pat. No. 10,097,780.
(Continued)

(51) Int. Cl.
H04N 5/378 (2011.01)
H01L 27/146 (2006.01)
(Continued)

(52) U.S. Cl.
CPC ......... H04N 5/378 (2013.01); H01L 27/1461 (2013.01); H01L 27/14607 (2013.01);
(Continued)

(58) Field of Classification Search
CPC ........ H04N 5/378; H04N 5/347; H04N 5/361; H04N 5/23245; H04N 5/33;
(Continued)

(56) References Cited

U.S. PATENT DOCUMENTS

2002/0025164 A1* 2/2002 Suzuki ................... G03B 17/48
396/429
2009/0009621 A1* 1/2009 Yamaguchi .............. H04N 5/33
348/222.1
(Continued)

OTHER PUBLICATIONS

KR Application # 10-2014-7012707 office action dated Sep. 21, 2018.

Primary Examiner — Tracy Y. Li
(74) Attorney, Agent, or Firm — Kligler & Associates

(57) ABSTRACT

Various embodiments comprise apparatuses and methods including a light sensor. In one embodiment, an integrated circuit includes an image sensing array region, a first photosensor having a light-sensitive region outside of the image sensing array region, and control circuitry. The control circuitry is arranged in a first mode to read out image data from the image sensing array region, where the data provide information indicative of an image incident on the image sensing array region of the integrated circuit. The control circuitry is arranged in a second mode to read out a signal from the first photosensor indicative of intensity of light incident on the light-sensitive region of the first photosensor. Electrical power consumed by the integrated circuit during the second mode is at least ten times lower than electrical power consumed by the integrated circuit during the first mode. Additional methods and apparatuses are described.

9 Claims, 22 Drawing Sheets

Related U.S. Application Data

(60) Provisional application No. 62/008,039, filed on Jun. 5, 2014.

(51) Int. Cl.

| | |
|---|---|
| *H04N 5/232* | (2006.01) |
| *H04N 5/347* | (2011.01) |
| *H04N 5/361* | (2011.01) |
| *G02B 5/20* | (2006.01) |
| *H04N 5/33* | (2006.01) |
| *G02B 23/12* | (2006.01) |

(52) U.S. Cl.
CPC .. *H01L 27/14621* (2013.01); *H01L 27/14625* (2013.01); *H01L 27/14649* (2013.01); *H01L 27/14665* (2013.01); *H01L 27/14667* (2013.01); *H01L 27/14669* (2013.01); *H04N 5/23241* (2013.01); *H04N 5/347* (2013.01); *H04N 5/361* (2013.01); *G02B 5/208* (2013.01); *G02B 23/12* (2013.01); *H04N 5/23245* (2013.01); *H04N 5/33* (2013.01)

(58) Field of Classification Search
CPC ........... H01L 27/1461; H01L 27/14621; H01L 27/14649; H01L 27/14665; H01L 27/14667; H01L 27/14669; G02B 5/208; G02B 23/12

See application file for complete search history.

(56) References Cited

U.S. PATENT DOCUMENTS

| | | |
|---|---|---|
| 2009/0152664 A1 | 6/2009 | Klem et al. |
| 2010/0123665 A1 | 5/2010 | Birkler |
| 2010/0280988 A1 | 11/2010 | Underkoffer et al. |
| 2012/0168608 A1* | 7/2012 | Matsumoto ....... H01L 27/14843 250/208.1 |
| 2013/0016203 A1* | 1/2013 | Saylor ................ G06K 9/00604 348/78 |

* cited by examiner

SENSORS AND SYSTEMS FOR THE CAPTURE OF SCENES AND EVENTS IN SPACE AND TIME

PRIORITY CLAIM

The present application is a division of U.S. patent application Ser. No. 14/732,314, filed Jun. 5, 2015, which claims the benefit of priority of U.S. Provisional Patent Application Ser. No. 62/008,039, filed Jun. 5, 2014, and entitled "SENSORS AND SYSTEMS FOR THE CAPTURE OF SCENES AND EVENTS IN SPACE AND TIME," which is incorporated herein by reference in its entirety.

TECHNICAL FIELD

The present application relates generally to the field of optical and electronic systems and methods, and methods of making and using the devices and systems.

BACKGROUND

Mobile devices are widely employed for communications, computing, and social media. They include camera systems—often at least two, a rear-facing and front-facing—for the capture of images. These camera systems can also be regarded as input devices for the communication between the user of the mobile device, and the mobile device's software and systems. One means of communication these camera systems can enable is recognition of gestures in space and time implemented by the user of the mobile device.

The consumption of electrical power by mobile devices is an object of continued focus, with the goal being to minimize power and, for a given battery, extend the operating lifetime of the device between required charges.

BRIEF DESCRIPTION OF THE DRAWINGS

FIG. 12 shows an embodiment of a single-plane computing device that may be used in computing, communication, gaming, interfacing, and so on;

FIG. 13 shows an embodiment of a double-plane computing device that may be used in computing, communication, gaming, interfacing, and so on;

DETAILED DESCRIPTION

Various embodiments described herein provide a means of utilizing a camera system as an image-capture device, and also as gesture-recognition device, while minimizing power consumption.

In example embodiments, the imaging array region operates at power only when being used in image capture commensurate with its resolution. During periods of time when gesture recognition, or proximity detection, is desired, power is minimized by providing power only to sensing regions.

In embodiments, the sensing regions reside on the same integrated circuit as the imaging array.

In embodiments, the sensing regions are read using circuitry on the same integrated circuit, but providing for much lower power operation than if the image array region circuitry were being employed.

In embodiments, the sensing regions are read using circuitry provided off-chip. In such embodiments, the sensing regions could be termed passive: they consist of, for example, light-absorbing materials, clad by electrical contacts, where electrically conductive materials provide for the conveyance of electrical signals for subsequent readout using separate low-power circuits.

Figure 1A:
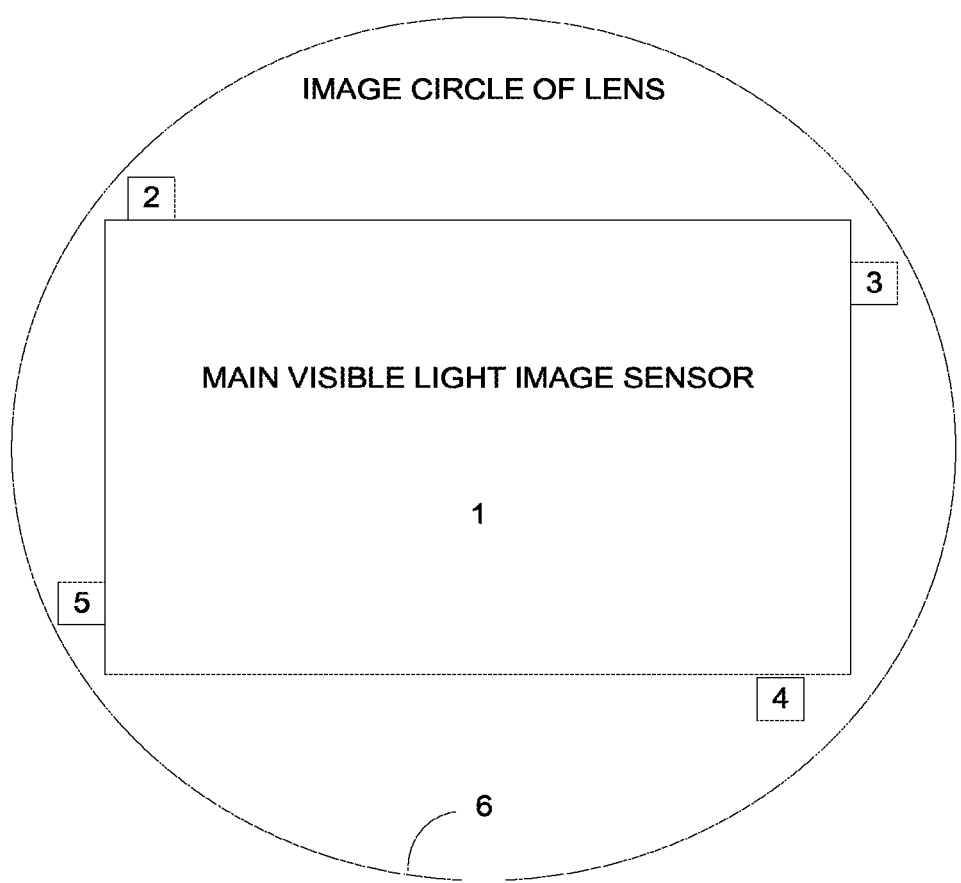
FIGS. 1A, 1B, 2A, 2B, and 4 through 6 show embodiments of an image sensor array on which images are projected and registered, with additional sensing regions being shown, within an image circle of a lens.

Depicted in FIG. 1A is an embodiment of the disclosed subject matter. Region 1 is the image sensor array on which images are projected and registered. Regions 2, 3, 4, 5 are additional sensing regions. Region 6 depicts the image circle, i.e., region 6 represents the projection of the focusing lens system onto the plane of the image sensor. Labels are analogous in FIG. 1B.

Figure 1B:
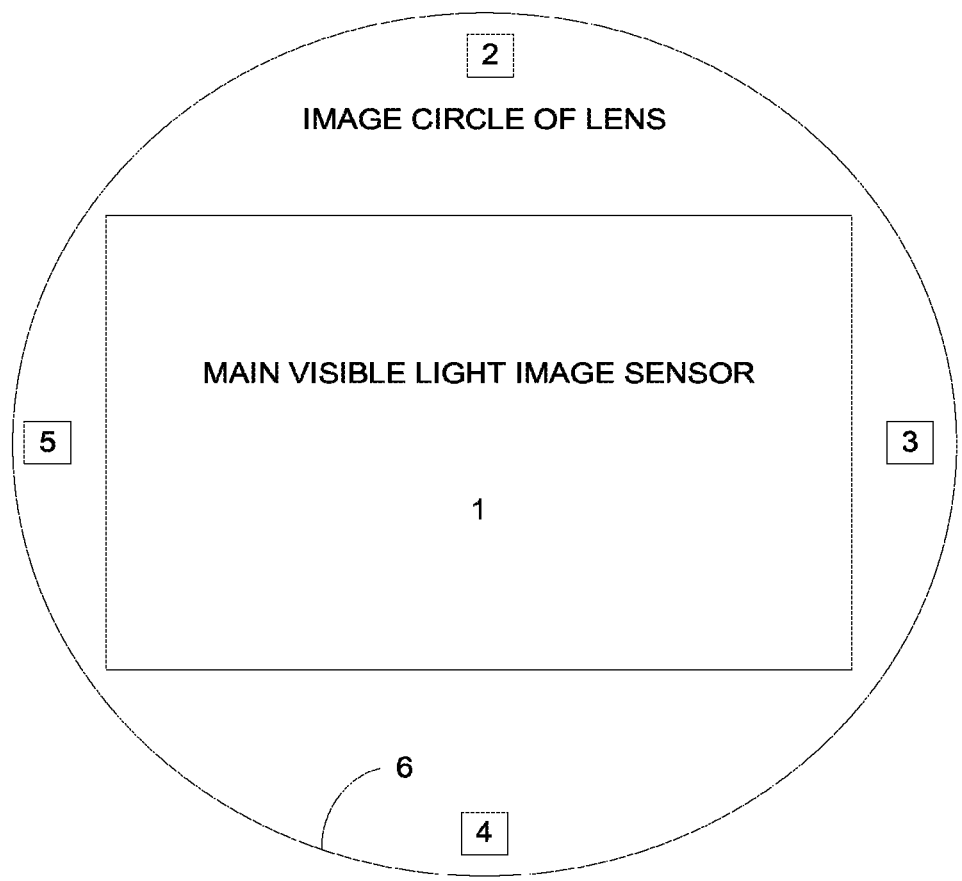

As depicted in FIGS. 1A and 1B, the additional sensing regions 2, 3, 4, 5 have been placed such that they lie outside of rectangular image sensor region 1; yet lie within the image circle 6.

As a result, Regions 2, 3, 4, 5 will be exposed to illumination that is similarly in-focus as the illumination onto Region 1.

In embodiments, Regions 2, 3, 4, 5 may be employed as light sensors. In embodiments, Regions 2, 3, 4, 5 may be connected to on-chip electronic circuitry that provides for the digitization of levels proportional with the illumination over a period of time. In embodiments, these levels may be reported as a digital number DN.

In alternate embodiments, Regions 2, 3, 4, 5 collect photocurrent into on-chip charge stores that may be read using off-chip electronics.

In further alternate embodiments, Regions 2, 3, 4, 5 collect photocurrent that is carried off-chip for reading using off-chip circuitry.

In embodiments, light sensing using at least one of Regions 2, 3, 4, 5 can be provided while little or no electrical power is drawn by Region 1. As a result, a low-power operating mode may be provided wherein the light projected from a scene is registered using the Regions 2, 3, 4, 5.

In an embodiment, an illumination source may be employed to illuminate a scene; and Regions 2, 3, 4, 5 may be read for their DN, charge, or photocurrent levels to register light returning from the illuminated scene.

In various embodiments, IR sub arrays could be the same or larger pixels, and may use true GS Positioned in both examples to have an increased or maximum parallax error from its opposite. FIG. 1B shows placement if there is chip area there and it is efficient to have it that far out. In embodiments, all four IR sub arrays may have their own powering scheme so that when they are on it does not use full power of main array. In embodiments, a third tier of lower power in binned mode may be used so that these sub arrays could be used as massive pixels for proximity detection applications.

Figure 2A:
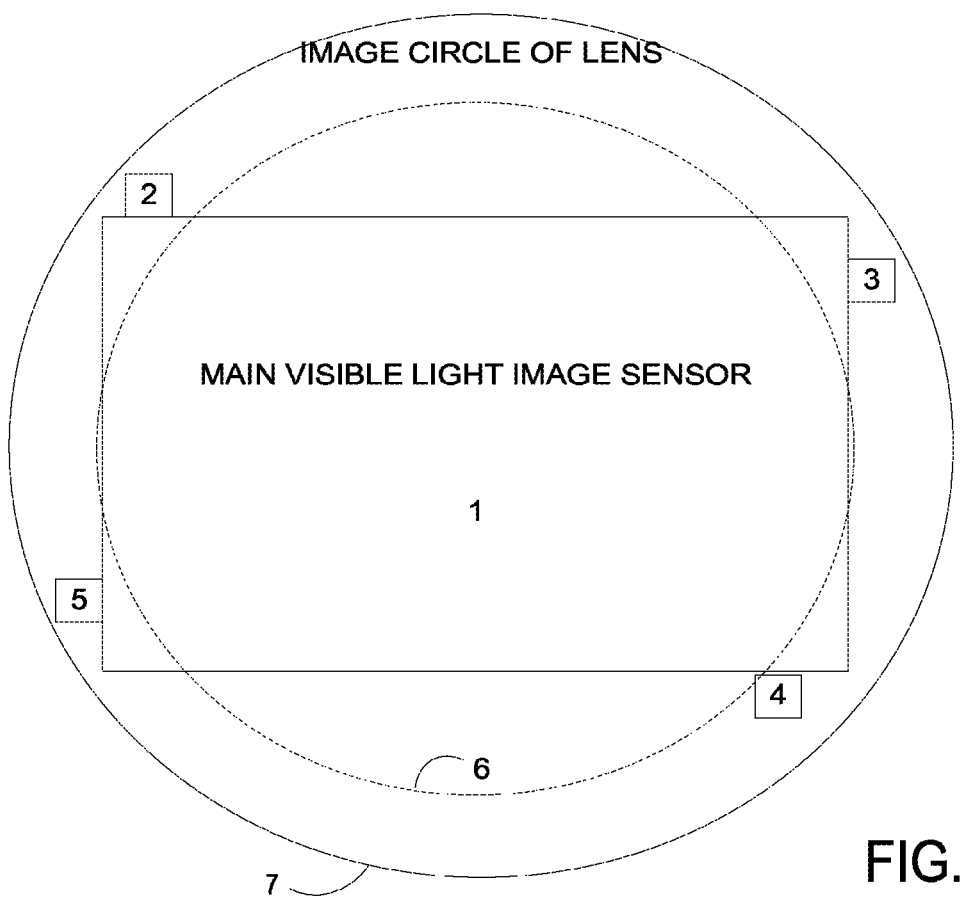
Figure 2B:
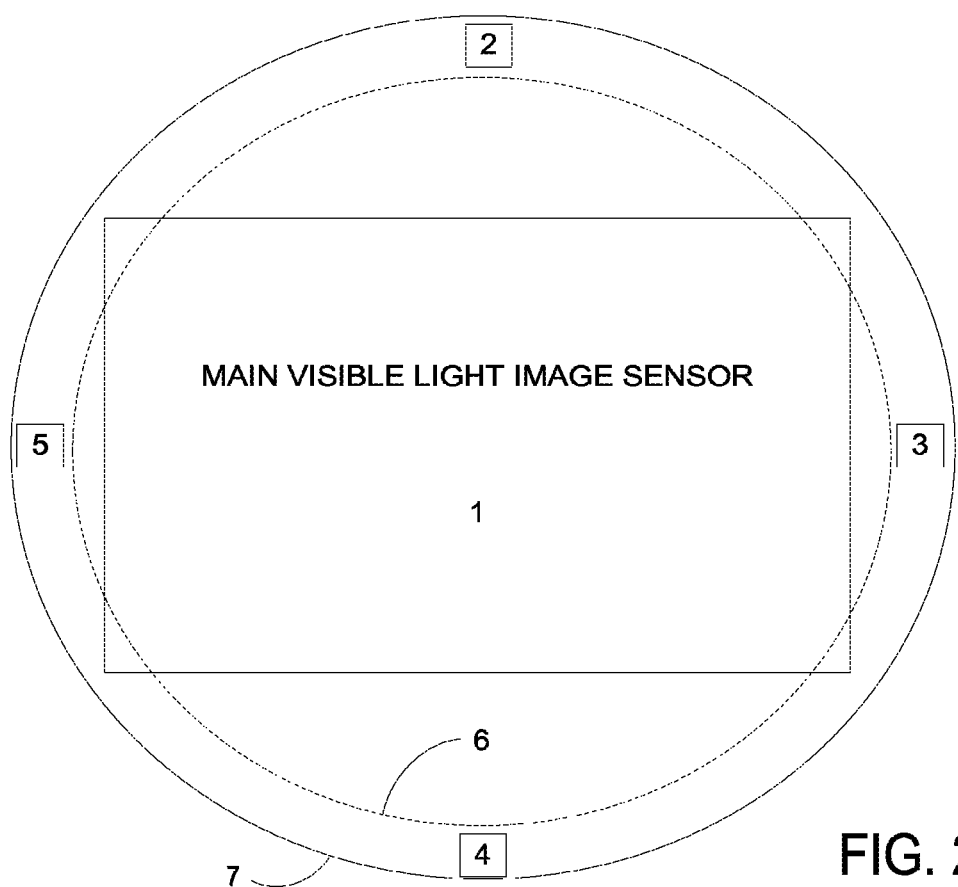

Referring to FIGS. 2A and 2B, cameras may employ a spectrally-selective filter, such as one that passes visible light to the visible-circle 6. A ring around the outside of circle 6, defined as outer shell 7, may continue to receive appreciable infrared light. In embodiments, sensing Regions 2, 3, 4, 5 may be placed within outer shell 7 such that they receive infrared illumination; whereas the majority of imaging array 1 may be elected to lie within the visible-receiving inner circle 6.

In embodiments, multiple, independently-powered light sensing regions are illuminated using a single optic. For example, the image sensor array represents a first independently-powered light sensing region. The at least one peripheral light sensors consume an electrical power that is substantially independent of the electrical power of the image sensor array.

In embodiments, a specialized IR filter could be employed where its efficiency of filtering IR can drop off as incident angles increase, allowing the IR sub arrays to receive more IR photons, while keeping the visible main array 1 shielded from IR. Some of the visible sensor's corners may be exposed to IR, but could be image processed out, especially since corner artifacts are expected anyways (such as lens shading). In the FIG. 2B, a stronger IR filter circle gets to be bigger covering more of the corners of the visible main array 1.

In various embodiments, IR sub arrays could be the same or larger pixels, and may use true GS Positioned in both examples to have an increased or maximum parallax error from its opposite. FIG. 2B shows placement if there is chip area there and it is efficient to have it that far out. In embodiments, all four IR sub arrays may have their own powering scheme so that when they are on it does not use full power of main array. In embodiments, a third tier of lower power in binned mode may be used so that these sub arrays could be used as massive pixels for proximity detection applications.

In an embodiment, an infrared illumination source may be employed to illuminate a scene. Imaging array region 1 will principally register visible light; and Regions 2, 3, 4, 5 will receive the sum of visible and infrared light, and may be read for their DN, charge, or photocurrent levels to register light returning from the illuminated scene. In embodiments, the image sensor circuit may include alignment marks that define a spatial relationship to the sensing array 1, facilitating alignment of the infrared-blocking element placement during module assembly.

In embodiments, the infrared filter may be provided that substantially overlies the array region 1, and offers a substantially rectangular shape similar to, and aligned with, region 1. In this embodiment, the regions outside the rectangular array region are provided with infrared light, whereas the rectangular array region receives principally visible light for imaging. In embodiments, a filter is provided that substantially removes infrared light from the image sensor plane over at least the dimensions of the image sensor array rectangle; and that allows infrared light to reach the image sensor surface in at least one of the peripheral image sensing regions.

In embodiments, the optical system used to collect and focus light onto the imaging array 1 may have a first field of view, such as for example 120°; yet it may be desired that the image sensors register light from a smaller field of view. In this embodiment, angularly-selective elements may be added on top of the sensing regions 2, 3, 4, 5. An example includes an aperture that protrudes vertically from the surface of the integrated circuit; and that ensures that light is collected only over a defined field of view. In embodiments, the image sensor circuit may include alignment marks that define a spatial relationship to the sensing regions 2, 3, 4, 5; facilitating alignment of the angularly-select element placement during module assembly.

In embodiments, image array regions and light sensing regions such as those may be accomplished by: Forming an integrated circuit; monolithically integrating an optically sensitive layer atop the integrated circuit to provide light sensing in the image array regions and the light sensing regions.

In embodiments, image array regions and light sensing regions such as those may be accomplished by: Forming an integrated circuit; monolithically integrating an optically sensitive layer atop the integrated circuit, and patterning it such that the originally-formed integrated circuit is no longer covered by the light-sensing layer, and its light sensing is provided by the originally-formed integrated circuit; while leaving the optically-sensitive material in the light sensing regions to provide light sensing.

In embodiments, image array regions and light sensing regions such as those may be accomplished by: Forming an integrated circuit; heterogeneously integrating light sensing materials or devices atop regions of the integrated circuit; where the light sensing materials or devices do not substantially disrupt image formation on the image array region; and where they provide additional light sensing capabilities such as those described herein.

In embodiments, a single class of monolithically-integrated optically sensitive layer may overlie portions of the integrated circuit. In regions of the integrated circuit where the optically sensitive layer overlies a pixelated region of pixel electrodes, the optically sensitive layer may function as the light absorber associated with numerous pixel regions, and the array of pixelated regions taken together with the optically sensitive layer may constitute an image sensor region portion of the integrated circuit. In regions of the integrated circuit where the optically sensitive layer overlies at least one large-area electrode, the large-area electrode combined with the optically sensitive layer may constitute a passive light sensor. In embodiments the passive light sensor may be used in a first low-power mode to sense a state or a gesture. In embodiments the image sensor portion of the integrated circuit may be employed in a second imaging mode in which the image sensor circuit portion is biased and operating, typically consuming at least 100 times more power than when operating in the first mode. An example embodiment is show in FIG. 1B, where the optically sensitive material overlying the main visible light image sensor (region 1 in FIG. 1B) is substantially of the same composition as the optically sensitive material overlying the peripheral sensing regions (2, 3, 4, 5). An example embodiment is show in FIG. 2A, where the optically sensitive material overlying the main visible light image sensor (region 1 in FIG. 2A) is substantially of the same composition as the optically sensitive material overlying the peripheral sensing regions (2, 3, 4, 5).

In embodiments, two distinct classes of monolithically-integrated optically sensitive layer may overlie portions of the integrated circuit. In regions of the integrated circuit where an optically sensitive layer overlies a pixelated region of pixel electrodes, the optically sensitive layer may function as the light absorber associated with numerous pixel regions, and the array of pixelated regions taken together with the optically sensitive layer may constitute an image sensor region portion of the integrated circuit. In an example embodiments in which the image sensor array is required to acquire visible-spectrum images, the optically sensitive layer overlying the image sensor region may be designed to sense visible light with high sensitivity. For example, the optically sensitive material in this image sensor array region may be a strong absorber of visible wavelengths of light in the range 480 nm to 630 nm, but it may be substantially transmissive to light (nonabsorbing of light) in for example the near infrared (NIR) region beyond 830 nm. In regions of the integrated circuit where an optically sensitive layer overlies at least one large-area electrode, the large-area electrode combined with the optically sensitive layer may constitute a passive light sensor. In an example embodiment in which the peripheral sensors are required to acquire infrared-spectrum light intensity related information, the optically sensitive layer overlying the peripheral regions may be designed to sense infrared light with high sensitivity. For example, the optically sensitive material in this peripheral sensor region may be a strong absorber of near infrared light in the spectral range 800 nm to 850 nm. In another embodiment, the optically sensitive material in this peripheral sensor region may be a strong absorber of near infrared light in the spectral range 900 nm to 950 nm. In embodiments the passive light sensor may be used in a first low-power mode to sense a state or a gesture. In embodiments the image sensor portion of the integrated circuit may be employed in a second imaging mode in which the image sensor circuit portion is biased and operating, typically consuming at least 100 times more power than when operating in the first mode. An example embodiment is show in FIG. 1B, where the optically sensitive material overlying the main visible light image sensor (region 1 in FIG. 1B) is of a first composition wherein it is principally a strong visible light absorber; and the optically sensitive material overlying the peripheral sensing regions (2, 3, 4, 5) is of a second composition wherein it is a strong NIR absorber. An example embodiment is show in FIG. 2A, where the optically sensitive material overlying the main visible light image sensor (region 1 in FIG. 2A) is of a first composition wherein it is principally a strong visible light absorber; and the optically sensitive material overlying the peripheral sensing regions (2, 3, 4, 5) is of a second composition where it is a strong NIR absorber.

In prior art, an image sensor array region is chiefly responsible for light absorption and light sensing; and an outer peripheral area beyond the typically rectangular image array is not utilized for light sensing, but instead is primarily employed in electronics. In cases the peripheral-to-the-rectangular-array region may be shielded from light impinging upon optically sensitive material using a light-obscuring material such as a metal or other substantially opaque material.

In embodiments of the disclosed subject matter, the region peripheral to the typically-rectangular image array region may be employed in light sensing. Optically sensitive material in the peripheral region may be disposed for highly efficient light absorption, as opposed to being obscured using substantially opaque material. In embodiments, the peripheral region may contain both analog, mixed-signal (such as an analog-to-digital converter), and/or digital electronic circuitry; and may also include optically sensitive material for light sensing. In embodiments, in the peripheral region, an optically sensitive layer may overlie electronic circuitry, and at least a portion of the electronic circuitry, in the peripheral region may perform functions that are not directly related to the performance of the light sensing function implemented by the overlying optically sensitive material. For example, a portion of the electronic circuitry may be devoted to managing and processing signals and digital information related to the image sensor array; while at least a portion of the optically sensitive material overlying the electronic circuitry may be devoted to sensing light from the peripheral (as distinct from the imaging array) region.

Figure 3A:
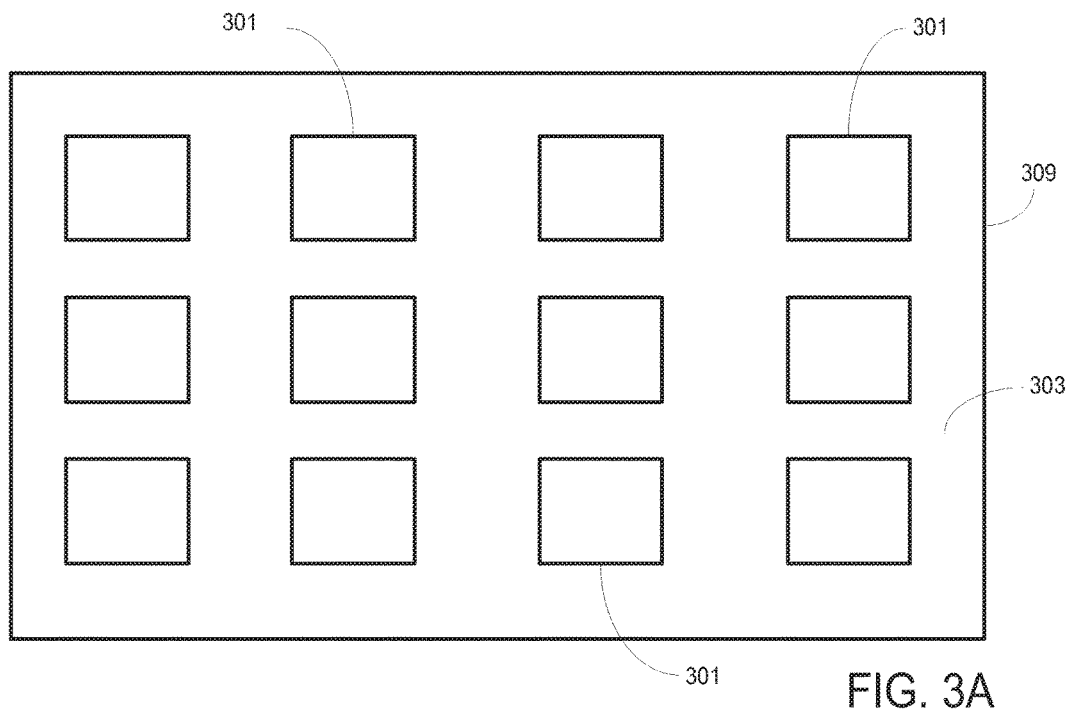
FIGS. 3A and 3B show a top view and a side view, respectively of current-collecting electrode set intended for use in a peripheral region of a chip.
Figure 3B:
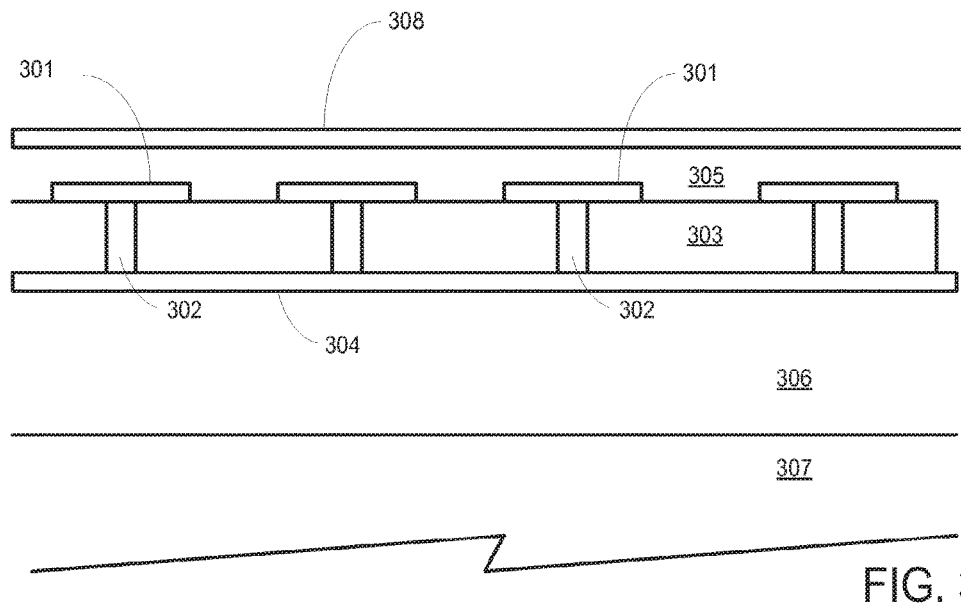

Referring now to FIG. 3A that shows a top view of an embodiment of the disclosed subject matter. In FIG. 3A, a current-collecting electrode set intended for use in a peripheral region of the chip is depicted. Features 301 present electrodes that collect photocharge from the optically sensitive layer. Features 303 are regions of dielectric. Referring to FIG. 3B, a side view of a cross-section through a row of electrodes 301 is provided. The electrodes are again denoted 301 and a dielectric such as, for example, $SiO_2$ or $Si_3N_4$ is labeled 303. Vias are labeled 302 and these provide conduction of current from the optically sensitive material 305 down to a common contact 304. Layer 304 may for example be Metal5 (M5) in a typical interconnect stack, and the metal electrodes may be formed using Metal6 (M6) of a typical interconnect stack. The label 306 represents the remaining interlayer dielectric between the substrate 307 (e.g., a silicon substrate) and the current-collecting system described by 301, 302, 303, 304. A top substantially transparent contact 308 may be used to provide for an electrical bias across the optically sensitive layer 305.

In embodiments, photoelectrons generated in the optically sensitive layer 305 are collected by the electrodes 301 while photoholes are collected by common top electrode 308. The currents flowing through the multiple electrodes 301 and vias 302 are aggregated in the common contact 304. The current may be monitored using a current-monitoring circuit that is connected to 304 and/or to 308, for these two contacts will collect photocurrents of similar amplitudes. The photocurrent is related to the rate of absorption of photons in the region of optically sensitive layer 305 that overlies the set of electrodes 301 (shown both in the top view of FIG. 3A and the side view of FIG. 3B). The effective area of the light sensor is defined approximately by the larger rectangle 309 of FIG. 3A that encompasses the set of electrodes 301. Although a 3×4 array of electrodes is shown, a person of ordinary skill in the art will recognize that more or fewer electrodes may be employed.

Referring again to FIG. 3B, a current is provided from at least one of the electrode 308 or the electrode 304 and that this current can be monitored. During this current-monitoring procedure, if image acquisition is not required by the central image sensor array, the integrated circuit may be powered down. In this example, an electrical bias between 304 and 308 can be provided by off-chip circuitry, such as a voltage supply elsewhere in a module or in a device (such as, for example, in a smartphone). Alternatively, during this current-monitoring procedure, if image acquisition is not required by the central image sensor array, the integrated circuit may supply an electrical bias between 304 and 308, and the chip can thus operate in an extreme low-power mode: for example, if full-speed image sensor readout mode required 250 of power, the extreme low-power mode could be a 1 mV power mode.

In embodiments in which electrons are to be collected using 304 electrode 304 can be positioned at, for example, +2 V, and electrode 308 can be positioned at, for example, −1 V. Ranges are possible, such as electrode 304 may be biased in the range of 1 V to 3 V, and electrode 308 may be biased in the range of −3 V to −1 V. Entirely positive bias ranges are possible, such as electrode 308 biased to ground, for example, 0 V, and electrode 304 biased to voltages in the range of, for example, +2 V to +4 V.

In embodiments in which electrons are to be collected using the electrode 308, the electrode 308 can be positioned at +2 V, and the electrode 304 can be positioned at −1 V. Ranges are possible, such as the electrode 308 being biased in the range of, for example, 1 V to 3 V, and the electrode 304 being biased in the range of, for example, −3 V to −1 V. Entirely positive bias ranges are possible, such as the electrode 304 being biased to ground, for example, 0 V, and the electrode 308 being biased to voltages in the range of, for example, +2 V to +4 V.

Figure 3C:
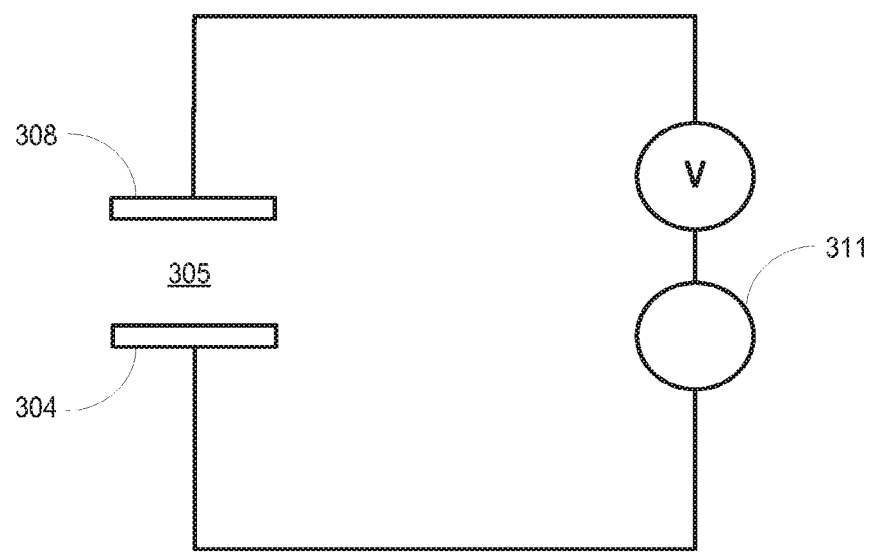
FIG. 3C shows a current monitor circuit that may be connected to the current collected through at least one of the electrodes of FIGS. 3A and 3B.

Referring now to FIG. 3C, the current through the electrode 308 and the electrode 304 can be monitored using a circuit. The current is proportional to the incident intensity of illumination of the light sensing region 309 of FIG. 3A.

With continuing reference to FIG. 3C, a current monitor 311 may be connected to the current collected through at least one of the electrodes 308 and 304. In embodiments, a charge pump may be used to provide a voltage (such as 3 V typically, with a range of, for example, 2 V to 4 V) to the electrode 304 while the electrode 308 is held at or near ground (typically 0 V). Using a clock, a capacitor, and a diode, the charge pump clock may be used to provide an estimate of the time-averaged current passing through the monitored node. The resultant counter value can be updated with a periodicity, such as at periodic intervals such as 1 millisecond intervals. In embodiments, the counter may be polled by a processor (such as a processor of a smartphone). If the value exceeds a threshold, this triggers an event seen by the processor, and the processor can be programmed to implement an action. For example, the processor can convey a "wake-up" event to a portion of the system (e.g., the smartphone).

Figure 4:
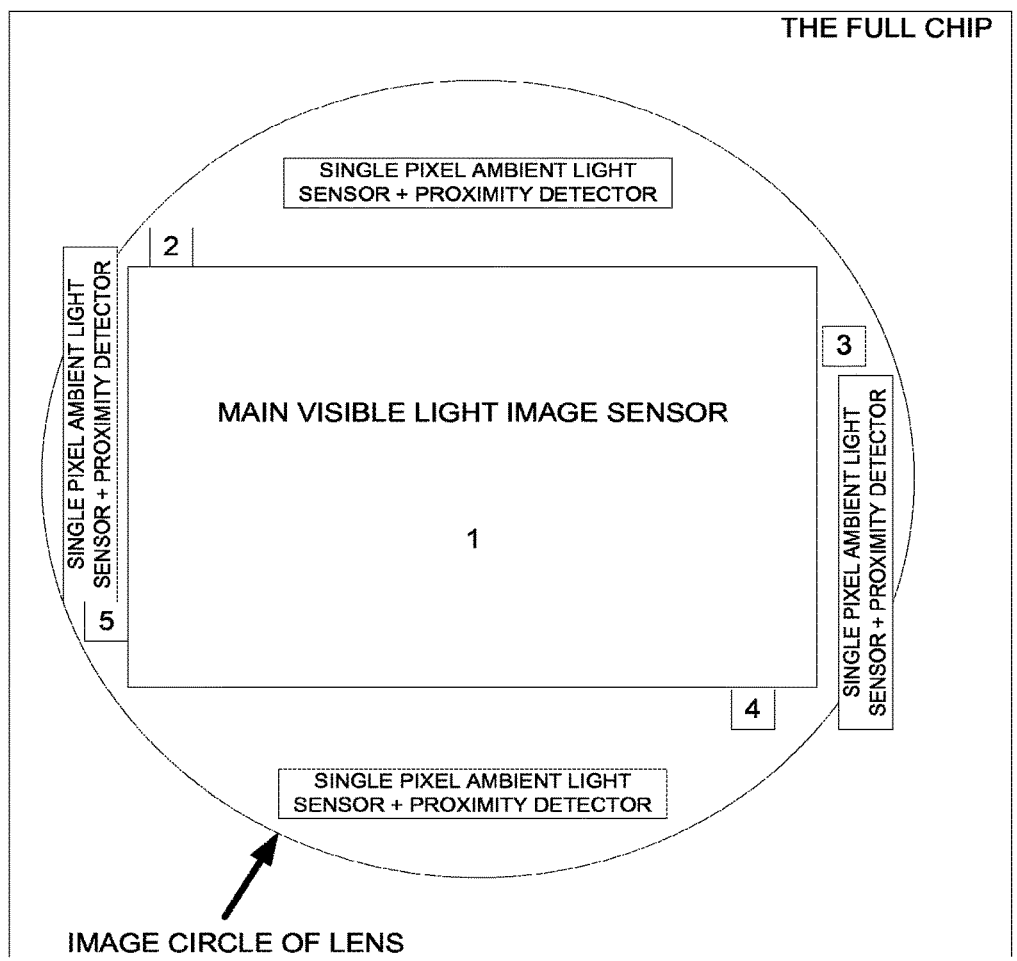
Figure 5:
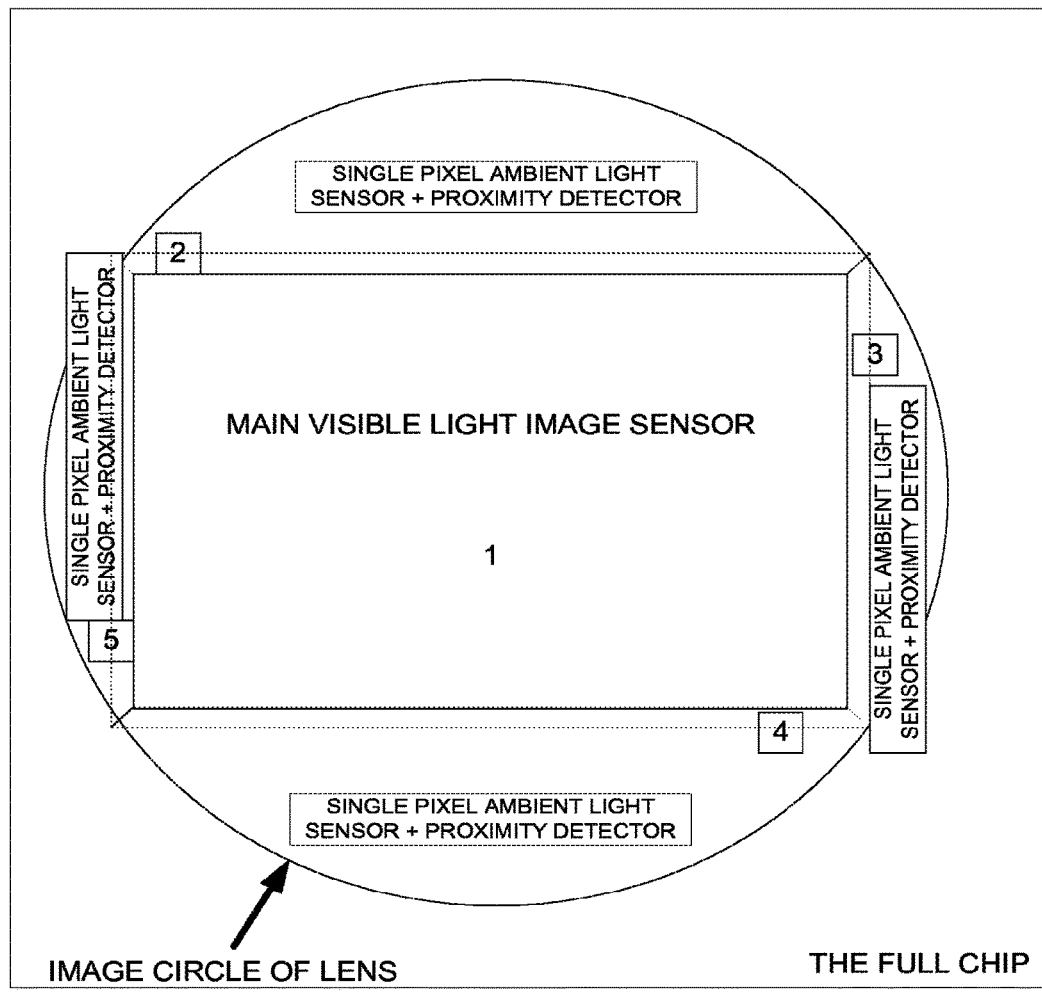
Figure 6:
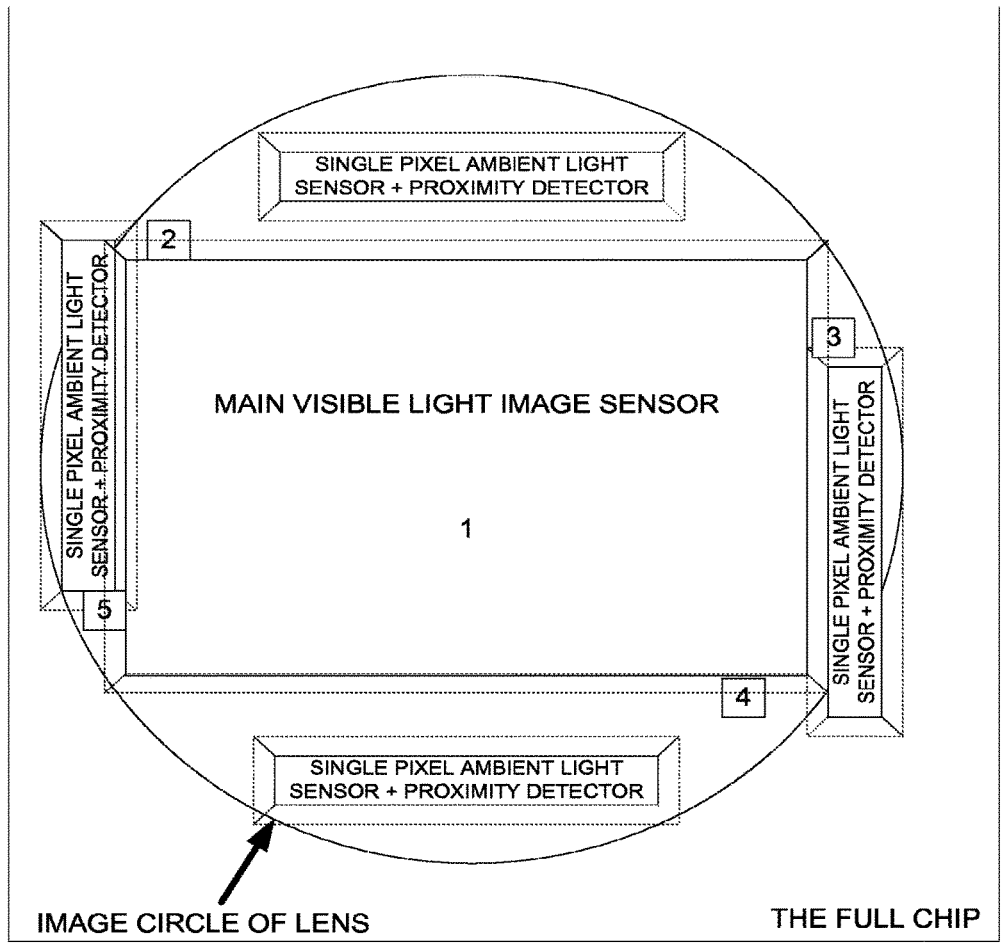

FIGS. 4 through 6 show additional embodiments of an image sensor array on which images are projected and registered, with additional sensing regions being shown, within an image circle of a lens. In the embodiment of FIG. 4, the four single pixel light and proximity IR sensors are Quantum Film layered on top of areas of the image sensor that are optically inactive and could operate independently or be combined/binned in analog to 1 pixel. They could also be used in passive mode, thereby reducing overall power consumption. In various embodiments, IR sub arrays could be the same or larger pixels, and may use true GS Positioned in both examples to have an increased or maximum parallax error from its opposite. FIG. 1B shows placement if there is chip area there and it is efficient to have it that far out. In embodiments, all four IR sub arrays may have their own powering scheme so that when they are on it does not use full power of main array. In embodiments, a third tier of lower power in binned mode may be used so that these sub arrays could be used as massive pixels for proximity detection applications.

In the embodiment of FIG. 5, the four single pixel light and proximity IR sensors are Quantum Film layered on top of areas of the image sensor that are optically inactive and could operate independently or be combined/binned in analog to 1 pixel. They could also be used in passive mode, thereby reducing overall power consumption. In various embodiments, a standard IR filter may be placed just on the main image sensor. Alignment can be achieved by, for example, providing alignment marks or mechanical anchors. In various embodiments, IR sub arrays could be the same or larger pixels, and may use true GS Positioned in both examples to have an increased or maximum parallax error from its opposite. FIG. 1B shows placement if there is chip area there and it is efficient to have it that far out. In embodiments, all four IR sub arrays may have their own powering scheme so that when they are on it does not use full power of main array. In embodiments, a third tier of lower power in binned mode may be used so that these sub arrays could be used as massive pixels for proximity detection applications.

In the embodiment of FIG. 6, the four single pixel light and proximity IR sensors are Quantum Film layered on top of areas of the image sensor that are optically inactive and could operate independently or be combined/binned in analog to 1 pixel. They could also be used in passive mode, thereby reducing overall power consumption. In various embodiments, a standard IR filter may be placed just on the main image sensor. Alignment can be achieved by, for example, providing alignment marks or mechanical anchors. In various embodiments, IR sub arrays could be the same or larger pixels, and may use true GS Positioned in both examples to have an increased or maximum parallax error from its opposite. FIG. 1B shows placement if there is chip area there and it is efficient to have it that far out. In embodiments, all four IR sub arrays may have their own powering scheme so that when they are on it does not use full power of main array. In embodiments, a third tier of lower power in binned mode may be used so that these sub arrays could be used as massive pixels for proximity detection applications. In one embodiment, given that the full field-of-view (FOV) of the main lens might be as wide as, for example, 120 degrees, for certain sensitive applications where one needs to be selectively sensitive to incoming IR light be specific angles, one may add a micro-optic to guide this specific light in. This light guide could be attached to the frame that holds the main IR cut filter.

In an example embodiment, ground (e.g., 0 V) may be provided to the top contact 308, and a positive potential may be provided by an off-chip source (such as the ISP) to the pixel electrodes 304. In an example embodiment, the light sensors function as purely passive devices, that is, they do not consume appreciable power from the image sensor circuit. In an example embodiment, the light sensor consumes power from an external device or module, such as an ISP, but does not consume appreciable power from the image sensor integrated circuit on which the light sensing film 305 of FIG. 3B is integrated.

In example embodiments, the optically sensitive material 305 of FIG. 3B may include a silicon light absorber. In embodiments, this may be referred to as back-side integration (BSI), a technology that may be employed to produce image sensors. In embodiments, the peripheral light sensor may be implemented using a silicon optically sensitive material 305. In embodiments, pixels may be connected via the reset gate to provide current collection. Silicon photodiodes whose current is aggregated such as to the contact 304 of FIG. 3B may be utilized for current (hence, light level) monitoring.

In embodiments, an image sensor integrated circuit comprises at least a first light sensing region comprised of small and independent pixels, and a second light sensing region comprised of larger pixels, or highly binned (current-combined) regions. For example, in the image sensor array region, pixels may have 1.1 µm×1.1 µm dimensions, 0.7 µm×0.7 µm dimensions, or 0.9 µm×0.9 µm dimensions; and peripheral light sensing regions may aggregate current over a much larger area, such as 10 µm×10 µm, or 100 µm×100 µm. In embodiments, the ratio of the area of the peripheral light sensing regions to the size of the independent pixels in the image array region may exceed 100:1. The use of large areas for light sensing in peripheral regions may facilitate the use of simple, low-cost, and/or off-integrated-circuit biasing and current metering. Embodiments of the disclosed subject matter herein include image sensing circuits that comprise, on a single semiconductor die, both an image sensor array, and also at least one independent light sensor powered and read using an independent circuit.

An example embodiment of low power light sensing system comprises a photosensor able to absorb photons and thereby produce a photocurrent that is related to incident light intensity. The photosensor may be made using the photosensitive material as that which comprises the image sensing region. In alternative embodiments, it may employ a photosensitive that is distinct from that used in the image sensing region.

An example implementation of a low power light sensing system comprises a photosensor that absorbs photons and produces a current that varies in relation with incident light intensity. The photosensor can be made using the same photosensitive material that comprises the imager pixel array. Alternatively, dedicated regions of photosensitive material and constitute photosensor regions. These can potentially be outside of the main image sensing region.

In an example embodiment, a low-power mode may be provided in which the circuitry associated with the image sensing array region are powered down. In embodiments, readout circuits may be powered down with the exception of the pixel reset transistor driver circuit, which will provide the signal necessary to keep pixels in reset (e.g., a Global Reset state).

In embodiments, the photosensor regions are constantly connected to a reset supply. An example embodiment of a reset supply may be on-chip internally generated.

An example embodiment of a reset supply may be externally generated. The photosensor regions can reside directly atop regions of readout circuitry that are associated not with reading the photosensor, but instead with performing other chip functions. Other chip functions may include the readout of at least one pixel comprising the image sensing array region.

In embodiments, a common optically sensitive material may overlie both the image sensing regions, and also the photosensing regions. In embodiments, the optically sensitive layer is in turn covered with a biasing electrode. In embodiments, this biasing electrode is driven using a voltage source generated on-chip. In embodiments, this biasing electrode is driven using an externally provided voltage source. The photosensing regions are biased to provide an electric potential between the top and bottom (pixel) electrodes. The current flowing through the top contact voltage source is related to the light intensity incident on the photosensing region. Ambient light levels can therefore be monitored by measuring this current.

In embodiments, the photocurrent can be monitored internally using on-chip circuitry. In an alternative embodiment, the photocurrent can be monitored externally using discrete devices.

In embodiments, the pixels or adjacent areas can be subdivided in smaller regions connected to different current monitors to produce independent measurements of spatially distributed areas.

In embodiments, such data can be used to detect motion, implement gesture control, or refine the quality of the ambient light measurement.

In embodiments, sensing is provided via a dedicated voltage supply for the drain of the pixels reset transistor. In embodiments, the corresponding current, i, can be monitored and the variation of current through this supply measured using on-chip or off chip circuitry. In embodiments, a low-power light-sensing mode is implemented by powering down the circuitry associated with the image sensing region; and retaining power to the reset transistor drivers, and, in the case of four transistor (4T) or multiple transistor pixels, also to the transfer gate drivers. The total current through the reset transistors of the pixel array can be monitored through the global reset supply. The current flowing though this voltage source is related to the light impinging on the photosensing region, enabling ambient light to be monitored by measuring this current.

In embodiments such data can be used to detect motion, implement gesture control or refine the quality of the ambient light measurement.

Figure 7:
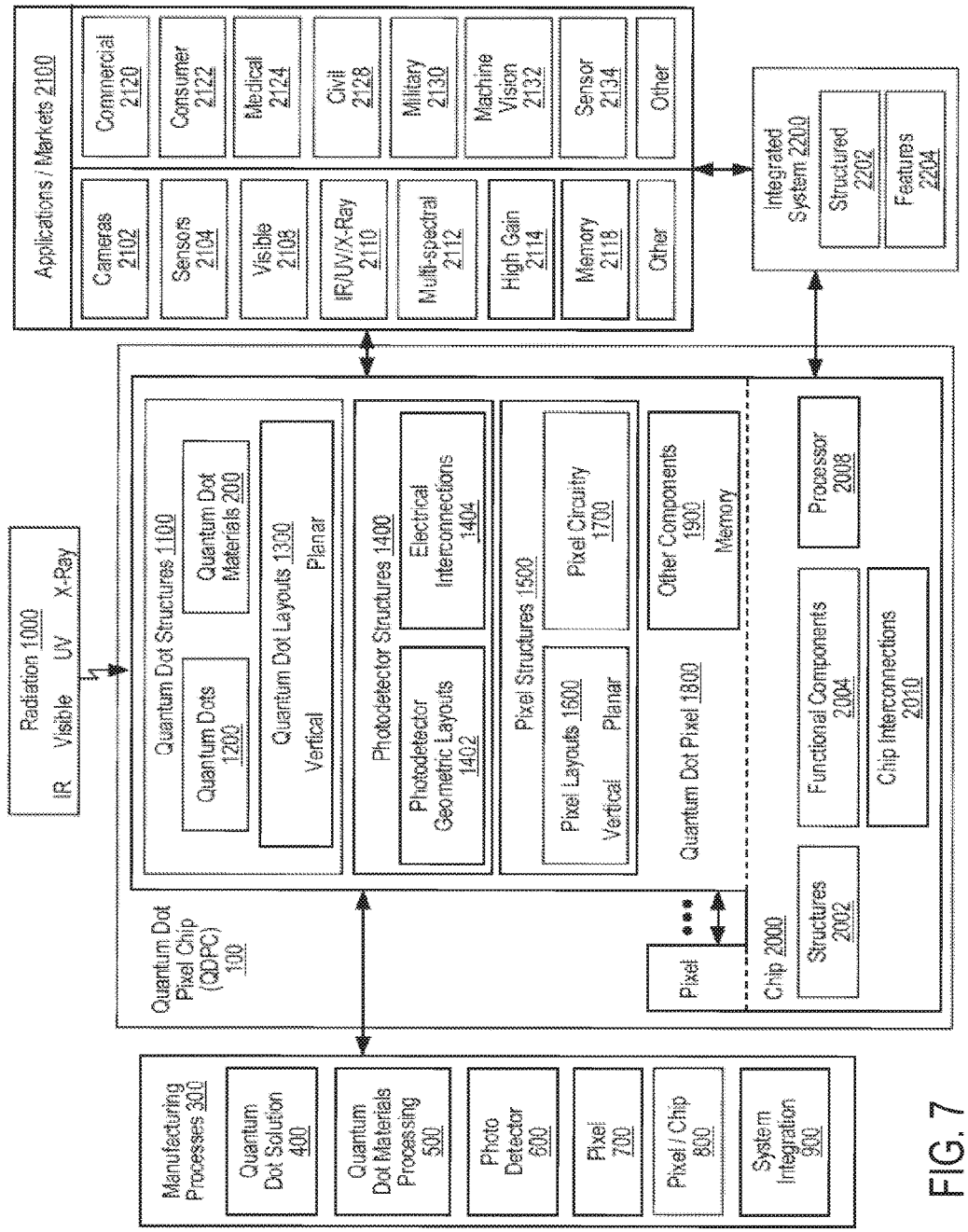
FIG. 7 shows overall structure and areas related to a quantum dot pixel chip, according to an embodiment.

Referring to FIG. 7, example embodiments provide image sensing regions that use an array of pixel elements to detect an image. The pixel elements may include photosensitive material. The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions, U.S. patent application Ser. No. 12/106,25, titled "Materials, Systems and Methods for Optoelectronic Devices," filed Apr. 18, 2008 (Publication No. 20090152664) includes additional descriptions of optoelectronic devices, systems and materials that may be used in connection with example embodiments and is hereby incorporated herein by reference in its entirety. This is an example embodiment only and other embodiments may use different photodetectors and photosensitive materials. For example, embodiments may use silicon or Gallium Arsenide (GaAs) photodetectors.

Image sensors incorporate arrays of photodetectors. These photodetectors sense light, converting it from an optical to an electronic signal. FIG. 7 shows structure of and areas relating to quantum dot pixel chip structures (QDPCs) 100, according to example embodiments. As illustrated in FIG. 7, the QDPC 100 may be adapted as a radiation 1000 receiver where quantum dot structures 1100 are presented to receive the radiation 1000, such as light. The QDPC 100 includes, as will be described in more detail herein, quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. In example embodiments, the pixel structures 1500 and pixel circuitry 1700 include structures and circuitry for film binning and/or circuit binning of separate color elements for multiple pixels as described herein. From an electrical viewpoint, the pixel circuitry 1700 may be in communication with other electronics (e.g., chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The other electronics may include circuitry or software to provide digital binning in example embodiments. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color'.

In the example embodiment of FIG. 7, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, color binning, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 8:
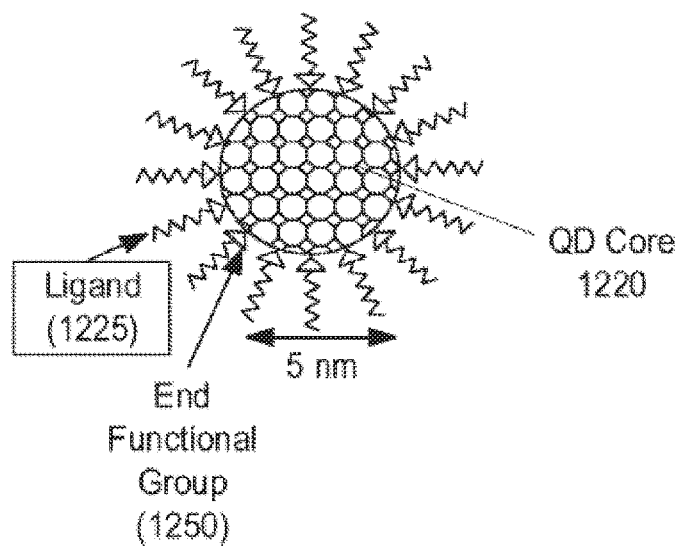
FIG. 8 shows an example of a quantum dot.

FIG. 8 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In some embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, or as large as 30 microns by 30 microns or more or any range subsumed therein.

Figure 9:
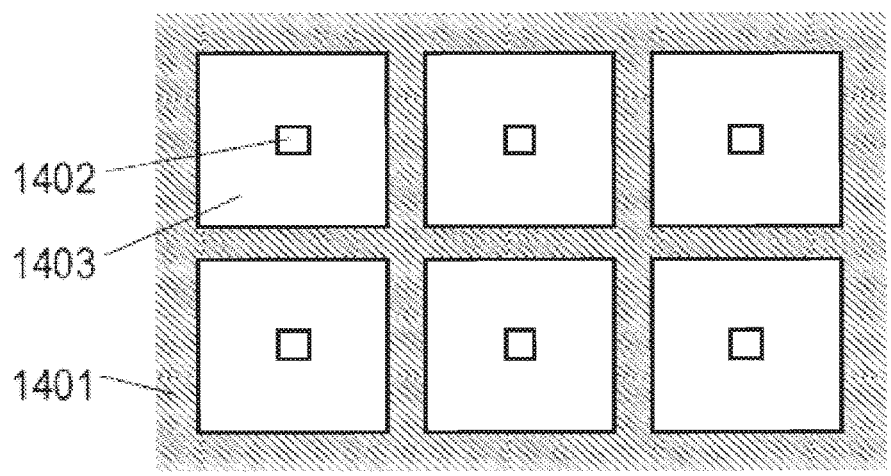
FIG. 9 shows a two-row by three-column sub-region within a generally larger array of top-surface electrodes.

The photodetector structure 1400 of FIGS. 7 and 9 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing may include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure. In example embodiments, binning may be used to combine subpixel elements for the same color or range of radiation (including UV and/or IR) to provide separate elements for a superpixel while preserving color/UV/IR resolution as further described below.

In embodiments the chip may have functional components that enable high-speed readout capabilities, which may facilitate the readout of large arrays, such as 5 Mpixels, 6 Mpixels, 8 Mpixels, 12 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. However, shrinking chip size may mean, for a given number of pixels, smaller pixels. In existing approaches, since radiation 1000 must propagate through the interconnect layer onto the monolithically integrated silicon photodiode lying beneath, there is a fill-factor compromise, whereby part of the underlying silicon area is obscured by interconnect; and, similarly, part of the silicon area is consumed by transistors used in read-out. One workaround is micro-lenses, which add cost and lead to a dependence in photodiode illumination on position within the chip (center vs. edges); another workaround is to go to smaller process geometries, which is costly and particularly challenging within the image sensor process with its custom implants.

In embodiments, the technology discussed herein may provide a way around these compromises. Pixel size, and thus chip size, may be scaled down without decreasing fill factor. Larger process geometries may be used because transistor size, and interconnect line-width, may not obscure pixels since the photodetectors are on the top surface, residing above the interconnect. In the technology proposed herein, large geometries such as 0.13 μm and 0.18 μm may be employed without obscuring pixels. Similarly, small geometries such as 90 nm and below may also be employed, and these may be standard, rather than image-sensor-customized, processes, leading to lower cost. The use of small geometries may be more compatible with high-speed digital signal processing on the same chip. This may lead to faster, cheaper, and/or higher-quality image sensor processing on chip. Also, the use of more advanced geometries for digital signal processing may contribute to lower power consumption for a given degree of image sensor processing functionality.

Figure 11:
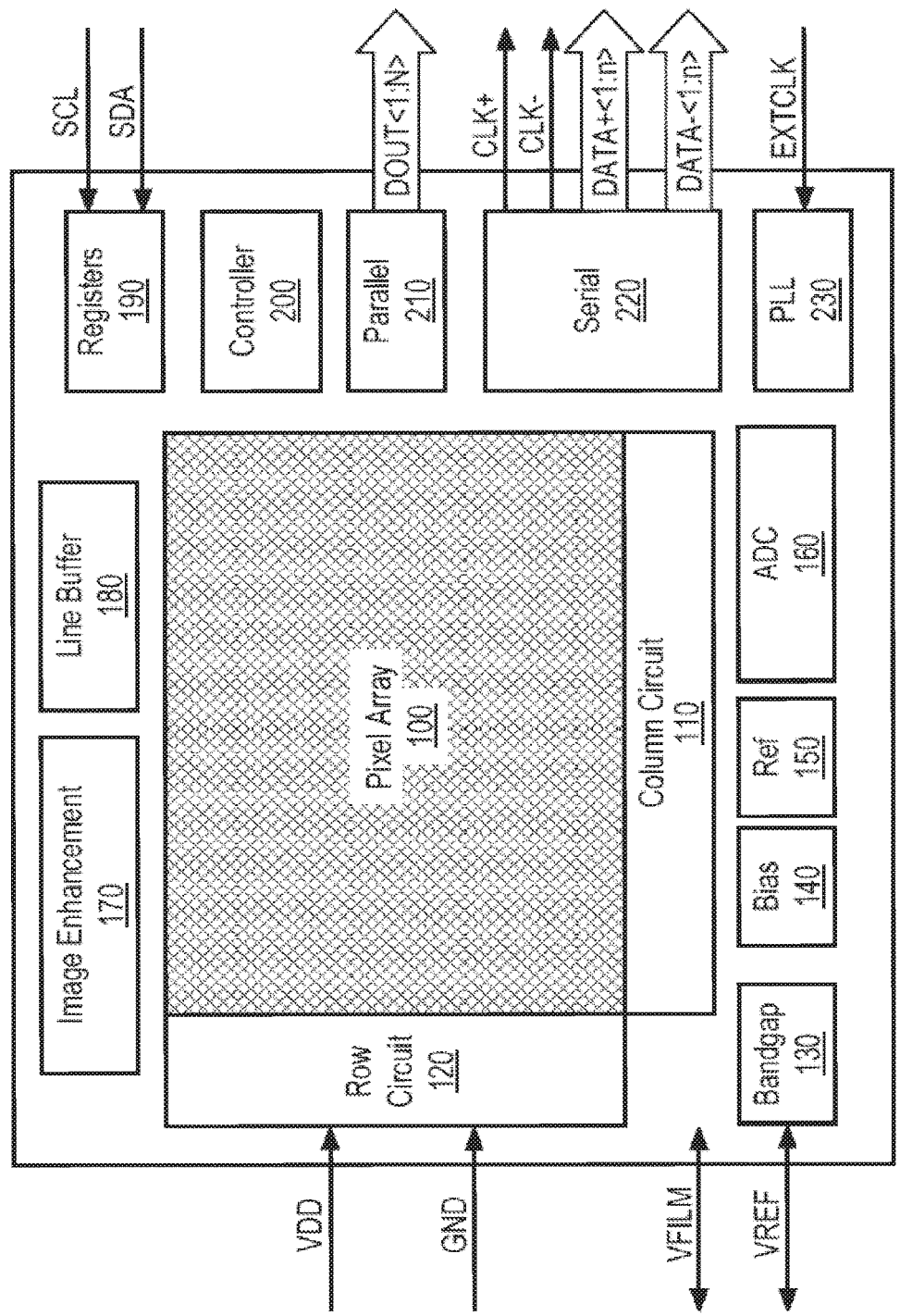
FIG. 11 is a block diagram of an example system configuration that may be used in combination with embodiments described herein.

An example integrated circuit system that can be used in combination with the above photodetectors, pixel regions and pixel circuits will now be described in connection with FIG. 11. FIG. 11 is a block diagram of an image sensor integrated circuit (also referred to as an image sensor chip). The chip includes:

a pixel array (100) in which incident light is converted into electronic signals, and in which electronic signals are integrated into charge stores whose contents and voltage levels are related to the integrated light incident over the frame period; the pixel array may include color filters and electrode structures for color film binning as described further below;

row and column circuits (110 & 120) which are used to reset each pixel, and read the signal related to the contents of each charge store, in order to convey the information related to the integrated light over each pixel over the frame period to the outer periphery of the chip; the pixel circuitry may include circuitry for color binning as described further below;

analog circuits (130, 140, 150, 160, 230). The pixel electrical signal from the column circuits is fed into the analog-to-digital convert (160) where it is converted into a digital number representing the light level at each pixel. The pixel array and AUC are supported by analog circuits that provide bias and reference levels (130, 140, & 150).

digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip. The digital circuits may also include circuits or software for digital color binning;

IO circuits (210 & 220) support both parallel input/output and serial input/output. (210) is a parallel IO interface that outputs every bit of a pixel value simultaneously. (220) is a serial IO interface where every bit of a pixel value is output sequentially.

a phase-locked loop (230) provides a clock to the whole chip.

In a particular example embodiment, when 0.11 µm CMOS technology node is employed, the periodic repeat distance of pixels along the row-axis and along the column-axis may be 900 nm, 1.1 µm, 1.2 µm, 1.4 µm, 1.75 µm, 2.2 µm, or larger. The implementation of the smallest of these pixels sizes, especially 900 nm, 1.1 µm, and 1.2 µm, may require transistor sharing among pairs or larger group of adjacent pixels in some embodiments.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack.

Example embodiments include an image sensor circuit that includes an image sensing region (such as FIG. 1A, Main Visible Image Sensor); and at least a first photosensor proximate the image sensor (such as FIG. 1A, element numbers (1), (2), etc.). The at least one photosensor includes a light-sensitive region that resides outside of the image sensing region. In a first mode, control circuitry is configured to read out image data from the image sensing region that is indicative of an image incident on image sensing region. In a second mode, the circuitry is configured to read out a signal from the at least first photosensor. This current is indicative of intensity of light incident on the light-sensitive region of the first photosensor. In embodiments, the total power consumed by the integrated circuit in the first mode may exceed 100 mW. In embodiments, the total power consumed by the integrated circuit in the second mode may be less than 10 mW. In the preceding sentences, the total integrated circuit power may be defined as the total electrical power transferred to the integrated circuit (typically the sum of all time-averaged current*voltage products at all nodes connected to external power circuitry). In embodiments, the image sensor and the at least one photosensor are fabricated atop a single piece of monolithic silicon, that is, atop a single substrate, a single die.

Figure 10:
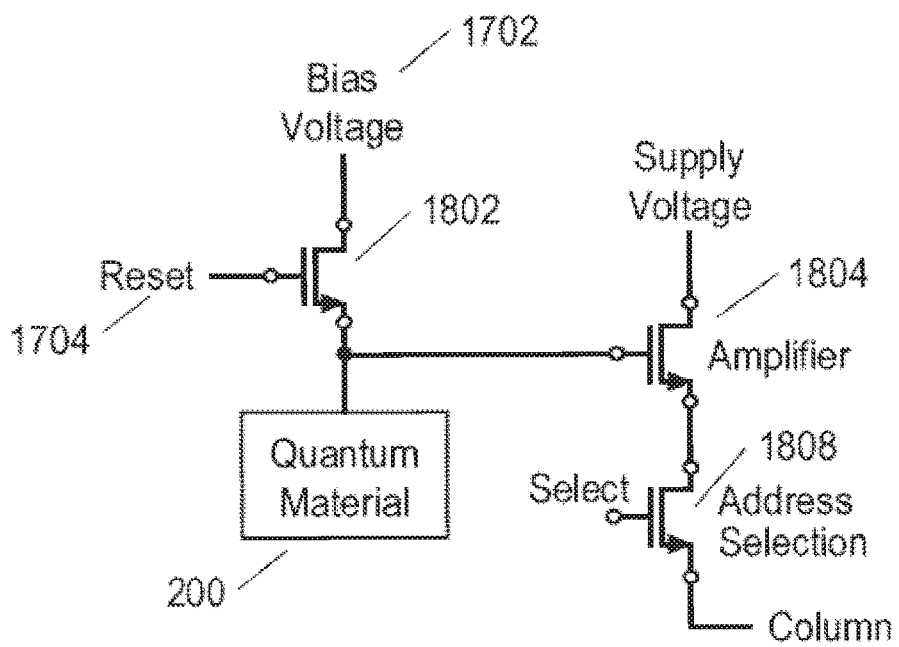
FIG. 10 illustrates a 3T transistor configuration for interfacing with the quantum dot material.

Embodiments include an integrated circuit comprising a semiconductor substrate; an image sensing region (such as FIG. 1A, Main Visible Image Sensor) that includes a plurality of optically-sensitive pixel regions (such as FIG. 9, the multiple regions 1403 each constituting a pixel electrode collecting photocharges from an overlying optically sensitive material); a pixel circuit comprising circuitry formed on the semiconductor substrate for each pixel region, each pixel circuit comprising a charge store and a read-out circuit (such as shown in FIG. 10); and a photosensor region outside of the image sensing region (such as FIG. 1A, element numbers (1), (2), etc.); and a read-out circuit for the photosensitive region configured to read out a signal from the photosensor region that is indicative of intensity alight incident photosensitive region of the photosensor. In embodiments, the first photosensitive region (FIG. 1A, element number (1)) may offer a distinct field of view different from the field of view offered by a second photosensitive region (FIG. 1A, element number (2)).

Pixel circuitry may be defined to include components beginning at the electrodes in contact with the quantum dot material 200 and ending when signals or information is transferred from the pixel to ether processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout. One embodiment of a pixel circuit shown in FIG. 10 uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the photoconductive photovoltaic quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit. In example, embodiments, additional circuitry may be added for film binning or circuit binning.

Embodiments include a mobile device comprising a semiconductor substrate; an image sensing region (FIG. 1A, Main Visible Image Sensor) comprising pixel circuitry (e.g. FIG. 10, and FIG. 11, region 100 Pixel Array) formed on the semiconductor substrate and an optically sensitive material; a photosensor comprising read-out circuitry formed on the semiconductor substrate and a light sensitive region; circuitry configured to read-out an image from the image sensor (e.g. FIG. 11, row Circuit 120); a processor configured to process a signal read-out from the photosensor for gesture recognition, facial recognition, motion detection using light reflected from the scene and sensed by the photosensor; and control circuitry configured in at least one mode to provide power to read out the photosensor without providing power to read out the image sensing region; such that power consumption is reduced compared to a mode where the power is provided to operate the image sensing region. For example, in the mode when the image sensing region is operated and read and digital data are output corresponding to the image it detects, integrated circuit power may exceed 100 mW; whereas in the mode in which the photosensing regions are used to monitor events, gestures, motion, etc., integrated circuit power may be below 10 mW.

Figure 12:
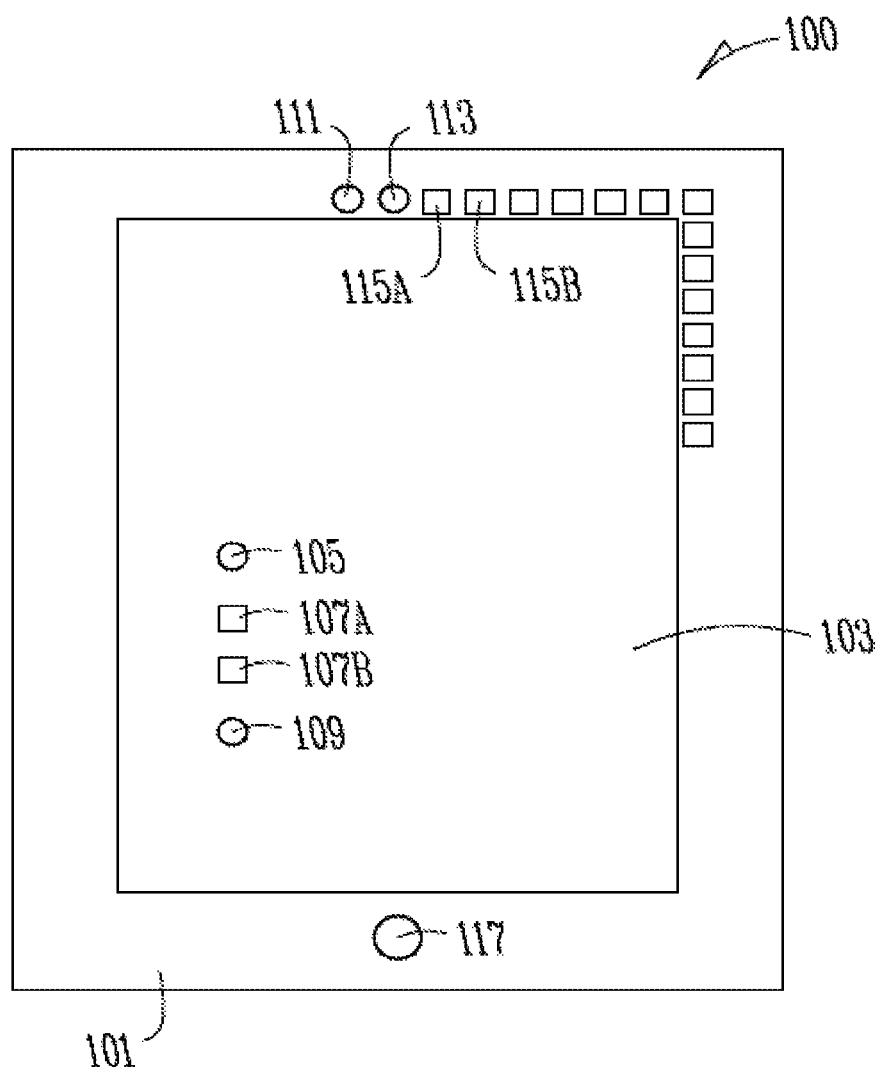

FIG. 12 shows an embodiment of a single-plane computing device 100 that may be used in computing, communication, gaming, interfacing, and so on. The single-plane computing device 100 is shown to include a peripheral region 101 and a display region 103. A touch-based interface device 117, such as a button or touchpad, may be used in interacting with the single-plane computing device 100.

An example of a first camera module 113 is shown to be situated within the peripheral region 101 of the single-plane computing device 100 and is described in further detail, below. Example light sensors 115A, 115B are also shown to be situated within the peripheral region 101 of the single-plane computing device 100 and are described in further detail, below, with reference to FIG. 15. An example of a second camera module 105 is shown to be situated in the display region 103 of the single-plane computing device 100 and is described in further detail, below, with reference to FIG. 14.

Examples of light sensors 107A, 107B, shown to be situated in the display region 103 of the single-plane computing device 100 and are described in further detail, below, with reference to FIG. 15. An example of a first source of optical illumination 111 (which may be structured or unstructured) is shown to be situated within the peripheral region 101 of the single-plane computing device 100. An example of a second source of optical illumination 109 is shown to be situated in the display region 103.

In embodiments, the display region 103 may be a touch-screen display. In embodiments, the single-plane computing device 100 may be a tablet computer. In embodiments, the single-plane computing device 100 may be a mobile handset.

Figure 13:
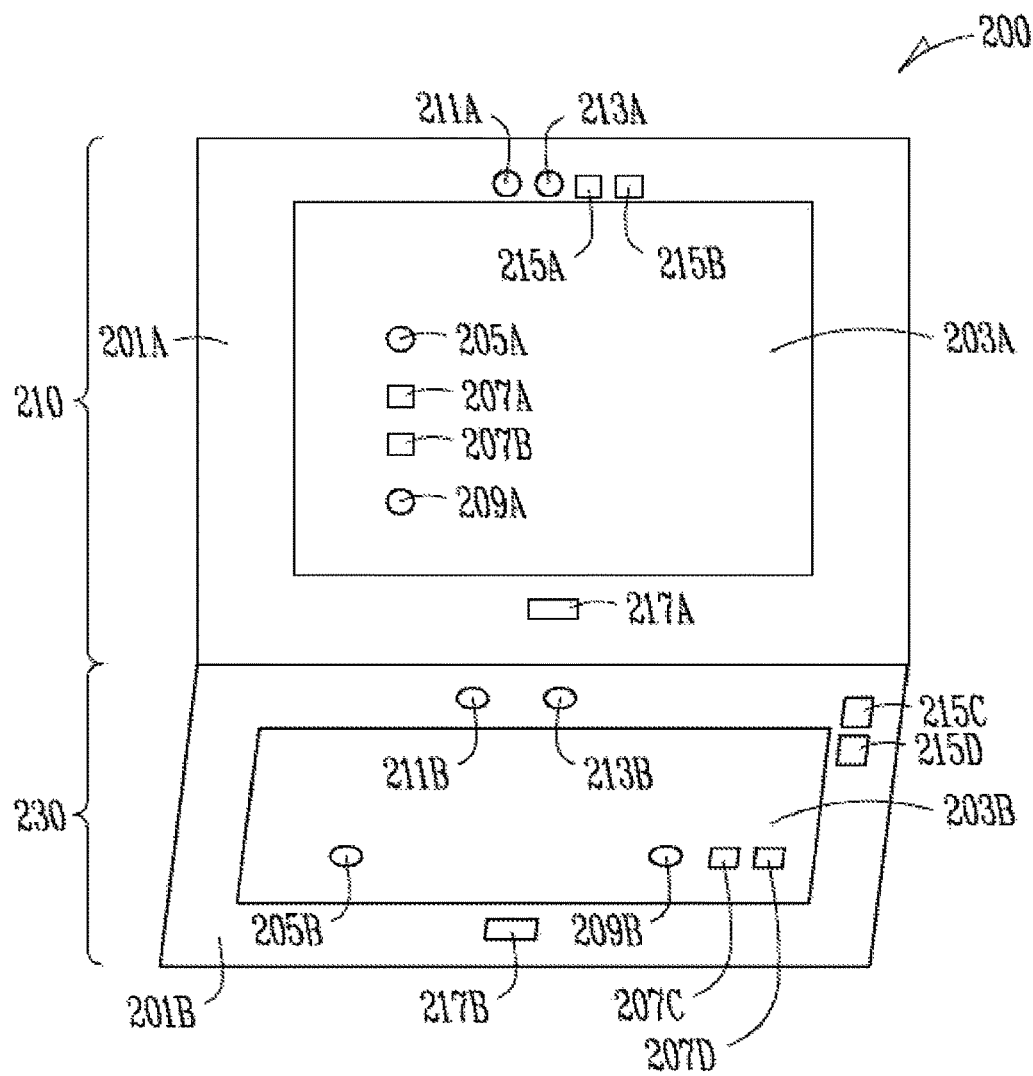

FIG. 13 shows an embodiment of a double-plane computing device 200 that may be used in computing, communication, gaming, interfacing, and so on. The double-plane computing device 200 is shown to include a first peripheral region 201A and a first display region 203A of a first plane 210, a second peripheral region 201B and a second display region 203B of a second plane 230, a first touch-based interface device 217A of the first plane 210 and a second touch-based interface device 217B of the second plane 230. The example touch-based interface devices 217A, 217B may be buttons or touchpads that may be used in interacting with the double-plane computing device 200. The second display region 203B may also be an input region in various embodiments.

The double-plane computing device 200 is also shown to include examples of a first camera module 213A in the first peripheral region 201A and a second camera module 213B in the second peripheral region 201B. The camera modules 213A, 213B are described in more detail, below, with reference to FIG. 14. As shown, the camera modules 213A, 213B are situated within the peripheral regions 201A, 201B of the double-plane computing device 200. Although a total of two camera modules are shown, a person of ordinary skill in the art will recognize that more or fewer light sensors may be employed.

A number of examples of light sensors 215A, 215B, 215C, 215D, are shown situated within the peripheral regions 201A, 201B of the double-plane computing device 200. Although a total of four light sensors are shown, a person of ordinary skill in the art will recognize that more or fewer light sensors may be employed. Examples of the light sensors 215A, 215B, 215C, 215D, are described, below, in further detail with reference to FIG. 4. As shown, the light sensors 215A, 215B, 215C, 215D, are situated within the peripheral regions 201A, 201B of the double-plane computing device 200.

The double-plane computing device 200 is also shown to include examples of a first camera module 205A in the first display region 203A and a second camera module 205B in the second display region 203B. The camera modules 205A, 205B are described in more detail, below, with reference to FIG. 14. As shown, the camera modules 205A, 205B are situated within the display regions 203A, 203B of the double-plane computing device 200. Also shown as being situated within the display regions 203A, 203B of the double-plane computing device 200 are examples of light sensors 207A, 207B, 207C, 207D. Although a total of four light sensors are shown, a person of ordinary skill in the art will recognize that more or fewer light sensors may be employed. Examples of the light sensors 207A, 207B, 207C, 207D are described, below, in further detail with reference to FIG. 15. Example sources of optical illumination 211A, 211B are shown situated within the peripheral region 201A, 201B and other example sources of optical illumination 209A, 209B are shown situated within one of the display regions 203A, 203B and are also described with reference to FIG. 15, below. A person of ordinary skill in the art will recognize that various numbers and locations of the described elements, other than those shown or described, may be implemented.

In embodiments, the double-plane computing device 200 may be a laptop computer. In embodiments, the double-plane computing device 200 may be a mobile handset.

Figure 14:
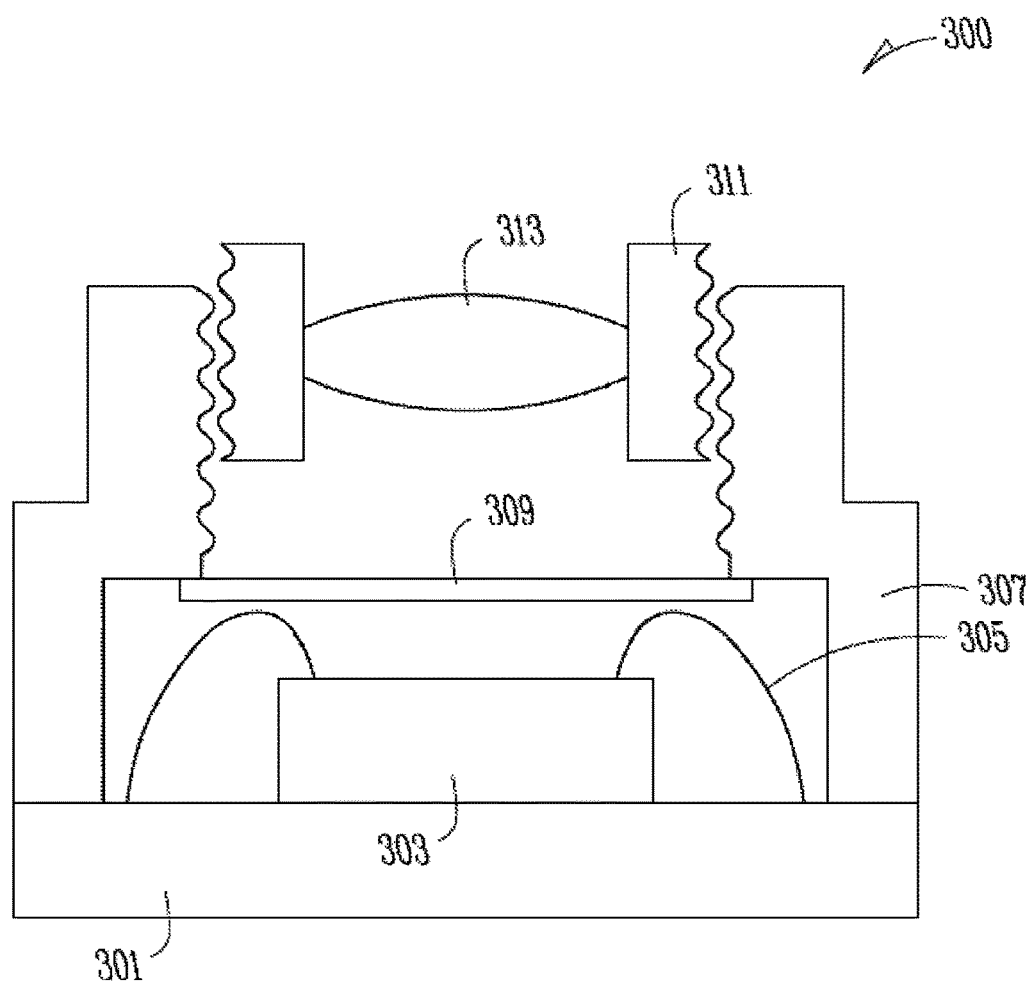
FIG. 14 shows an embodiment of a camera module that may be used with the computing devices of FIG. 12 or FIG. 13.

With reference now to FIG. 14, an embodiment of a camera module 300 that may be used with the computing devices of FIG. 12 or FIG. 13 is shown. The camera module 300 may correspond to the camera module 113 of FIG. 12 or the camera modules 213A, 213B of FIG. 13. As shown in FIG. 14, the camera module 300 includes a substrate 301, an image sensor 303, and bond wires 305. A holder 307 is positioned above the substrate. An optical filter 309 is shown mounted to a portion of the holder 307. A barrel 311 holds a lens 313 or a system of lenses.

Figure 15:
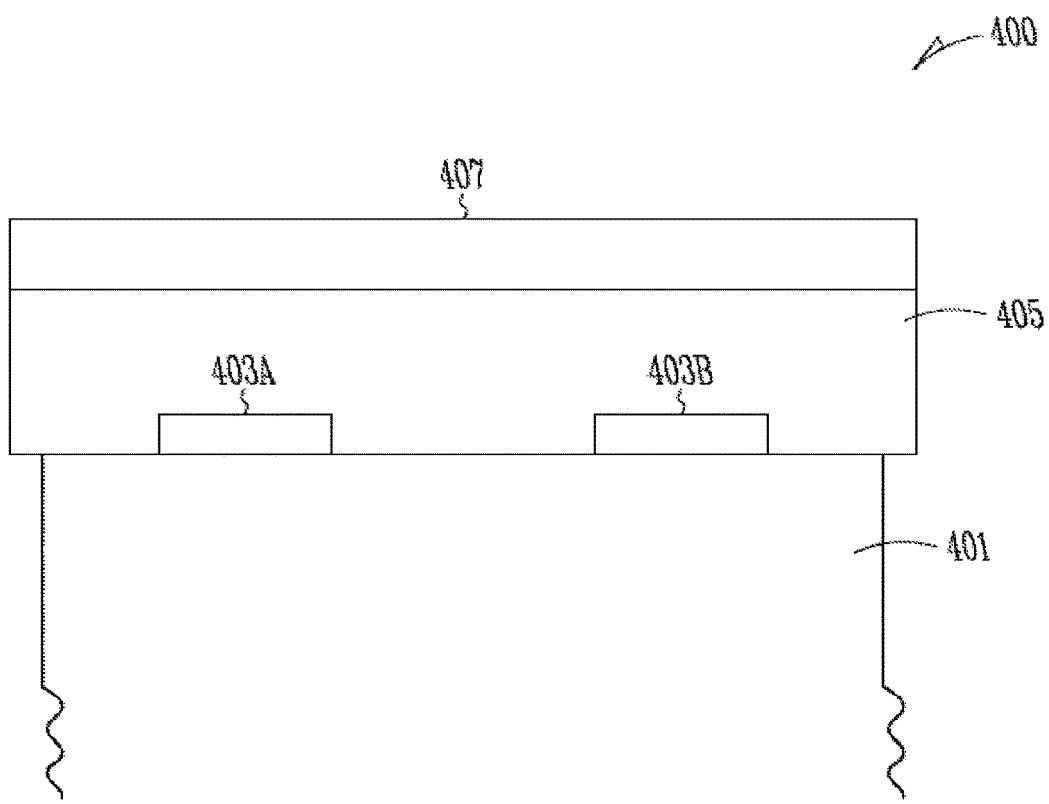
FIG. 15 shows an embodiment of a light sensor that may be used with the computing devices of FIG. 12 or FIG. 13.

FIG. 15 shows an embodiment of a light sensor 400 that may be used with the computing devices of FIG. 12 or FIG. 13 an example embodiment of a light sensor. The light sensor 400 may correspond to the light sensors 115A, 115B of FIG. 12 of the light sensors 215A, 215B, 215C, 215D of FIG. 13. The light sensor 400 is shown to include a substrate 401, which may correspond to a portion of either or both of the peripheral region 101 or the display region 103 of FIG. 12. The substrate 401 may also correspond to a portion of either or both of the peripheral regions 201A, 201B or the display regions 203A, 203B of FIG. 13. The light sensor 400 is also shown to include electrodes 403A, 403B used to provide a bias across light-absorbing material 405 and to collect photoelectrons therefrom. An encapsulation material 407 or a stack of encapsulation materials is shown over the light-absorbing material 405. Optionally, the encapsulation material 407 may include conductive encapsulation material for biasing and/or collecting photoelectrons from the light-absorbing material 405.

Elements of a either the single-plane computing device 100 of FIG. 12, or the double-plane computing device 200 of FIG. 13, may be connected or otherwise coupled with one another. Embodiments of the computing devices may include a processor. It may include functional blocks, and/or physically distinct components, that achieve computing, image processing, digital signal processing, storage of data, communication of data (through wired or wireless connections), the provision of power to devices, and control of devices. Devices that are in communication with the processor include devices of FIG. 12 may include the display region 103, the touch-based interface device 117, the camera modules 105, 113, the light sensors 115A, 115B, 107A, 107B, and the sources of optical illumination 109, 111. Similarly correspondences may apply to FIG. 13 as well.

The light sensor of FIG. 15 may include a light-absorbing material 405 of various designs and compositions. In embodiments, the light-absorbing material may be designed to have an absorbance that is sufficiently small, across the visible wavelength region approximately 450 nm to 650 nm, such that, in cases in which the light sensor of FIG. 15 is incorporated into the display region of a computing device, only a modest fraction of visible light incident upon the sensor is absorbed by the light-absorbing material. In this case, the quality of the images displayed using the display region is not substantially compromised by the incorporation of the light-absorbing material along the optical path of the display. In embodiments, the light-absorbing material 405 may absorb less than 30%, or less than 20%, or less than 10%, of light impinging upon it in across the visible spectral region.

In embodiments, the electrodes 403A, 403B, and, in the case of a conductive encapsulant for 407, the top electrode 407, may be constituted using materials that are substantially transparent across the visible wavelength region approximately 450 nm to 650 nm. In this case, the quality of the images displayed using the display region is not substantially compromised by the incorporation of the light-absorbing material along the optical path of the display.

In embodiments, the light sensor of FIG. 15 may include a light-sensing material capable of sensing infrared light. In embodiments, the light-sensing material may be a semiconductor having a bandgap corresponding to an infrared energy, such as in the range 0.5 eV-1.9 eV. In embodiments, the light-sensing material may have measurable absorption in the infrared spectral range; and may have measurable absorption also in the visible range. In embodiments, the light-sensing material may absorb a higher absorbance in the visible spectral range as in the infrared spectral range; yet may nevertheless be used to sense gesture-related signals in the infrared spectral range.

In an example embodiment, the absorbance of the light-sensing display-incorporated material may lie in the range 2-20% in the visible; and may lie in the range 0.1-5% in the infrared. In an example embodiment, the presence of visible light in the ambient, and/or emitted from the display, may produce a background signal within the light sensor, as a consequence of the material visible-wavelength absorption within the light-absorbing material of the light sensor. In an example embodiment, sensing in the infrared region may also be achieved. The light sources used in aid of gesture recognition may be modulated using spatial, or temporal, codes, allowing them to be distinguished from the visible-wavelength-related component of the signal observed in the light sensor. In an example embodiment, at least one light source used in aid of gesture recognition may be modulated in time using a code having a frequency component greater than 100 Hz, 1000 Hz, 10 kHz, or 100 kHz. In an example embodiment, the light sensor may have a temporal response having a cutoff frequency greater than said frequency components. In embodiments, circuitry may be employed to ensure that the frequency component corresponding to gesture recognition can be extracted and monitored, with the background components related to the room ambient, the display illumination, and other such non-gesture-related background information substantially removed. In this example, the light sensors, even though they absorb both visible and infrared light, can provide a signal that is primarily related to gestural information of interest in gesture recognition.

In an example embodiment, an optical source having a total optical power of approximately 1 mW may be employed. When illuminating an object a distance approximately 10 cm away, where the object has area approximately 1 $cm^2$ and diffuse reflectance approximately 20%, then the amount of power incident on a light sensor having area 1 cm2 may be of order 100 pW. In an example embodiment, a light sensor having absorbance of 1% may be employed, corresponding to a photocurrent related to the light received as a consequence of the illumination via the optical source, and reflected or scattered off of the object, and thus incident onto the light sensor, may therefore be of order pW. In example embodiments, the electrical signal reported by the light sensor may correspond to approximately pA signal component at the modulation frequency of the optical source. In example embodiments, a large additional signal component, such as in the nA or μA range, may arise due to visible and infrared background, display light, etc. In example embodiments, the relatively small signal components, with its distinctive temporal and/or spatial signature as provided by modulation (in time and/or space) of the illumination source, may nevertheless be isolated relative to other background/signal, and may be employed to discern gestural information.

In embodiments, light-absorbing material 405 may consist of a material that principally absorbs infrared light in a certain band; and that is substantially transparent to visible-wavelength light. In an example embodiment, a material such as PBDTT-DPP, the near-infrared light-sensitive polymer poly(2,60-4,8-bis(5-ethylhexylthienyl)benzo-[1,2-b;3, 4-b]dithiophene-alt-5-dibutyloctyl-3,6-bis(5-bromothiophen-2-yl)pyrrolo[3,4-c]pyrrole-1,4-dione), may be employed as a component of the light-absorbing layer.

In embodiments, the electronic signal produced by the light sensor may be communicated to a device for electronic amplification. This device may amplify a specific electronic frequency band more than other bands, producing an enhanced signal component that is related to the gestural information. The signal from the light sensor, possibly with the combination of amplification (potentially frequency-dependent), may be input to an analog-to-digital converter that can produce a digital signal related to the gestural information. The digital information related to gestural information can be further conveyed to other integrated circuits and/or signal processing engines in the context of a system. For example, it may be conveyed to an application processor.

In embodiments, optical sources used to illuminate a volume of space, with the goal of enabling gesture recognition, may use illumination at a near infrared wavelength that is substantially unseen by the human eye. In an example embodiment, a light-emitting diode having center wavelength of approximately 950 nm may be employed.

In embodiments, gesture recognition may be accomplished by combining information from at least one camera, embedded into the computing device, and having a lens providing a substantially focused image onto an image sensor that is part of the camera; and may also incorporate sensors in the peripheral region, and/or integrated into the display region. In embodiments, the distributed sensors may provide general information on the spatio-temporal movements of the object being imaged; and the signals from the at least one camera(s) may be combined with the distributed sensors' signals to provide a more spatially-/temporally-accurate picture of the two- or three-dimensional motion of the object whose gesture is to be recognized. In an example embodiment, the camera may employ an image sensor providing a modest spatial resolution, such as QVGA, VGA, SVGA, etc., and thus be implemented using an image sensor having small die size and thus low cost; and also be implemented using a camera module having small x, y, and z form factor, enabling minimal consumption of peripheral region area, and no substantial addition to the z-height of the tablet or other computing device. In embodiments, a moderate frame rate, such as 15 fps, 30 fps, or 60 fps may be employed, which, combined with a modest resolution, enables a low-cost digital communication channel and moderate complexity of signal processing in the recognition of gestures. In embodiments, the at least one camera module may implement wide field of view imaging in order to provide a wide angular range in the assessment of gestures in relation to a display. In embodiments, at least one camera module may be tilted, having its angle of regard nonparallel to the normal direction (perpendicular direction) to the display, enabling the at least one camera to image an angular extent in closer proximity to the display. In embodiments, multiple cameras may be employed in combination, each having an angle of regard distinct from at least one another, thereby enabling gestures in moderate proximity to the display to be imaged and interpreted. In embodiments, the at least one camera may employ an image sensor sensitized using light-detecting materials that provide high quantum efficiency, for example, greater than 30%, at near infrared wavelength used by the illuminating source; this enables reduced requirement for power and/or intensity in the illuminating source. In embodiments, the illuminating source may be modulated in time at a specific frequency and employing a specific temporal pattern (e.g., a series of pulses of known spacing and width in time); and the signal from the at least one camera and/or the at least one distributed sensor may be interpreted with knowledge of the phase and temporal profile of the illuminating source; and in this manner, increased signal-to-noise ratio, akin to lock-in or boxcar-averaging or other filtering and/or analog or digital signal processing methods, may be used to substantially pinpoint the moduled, hence illuminated signal, and substantially remove or minimize the background signal associated with the background scene.

Figure 16:
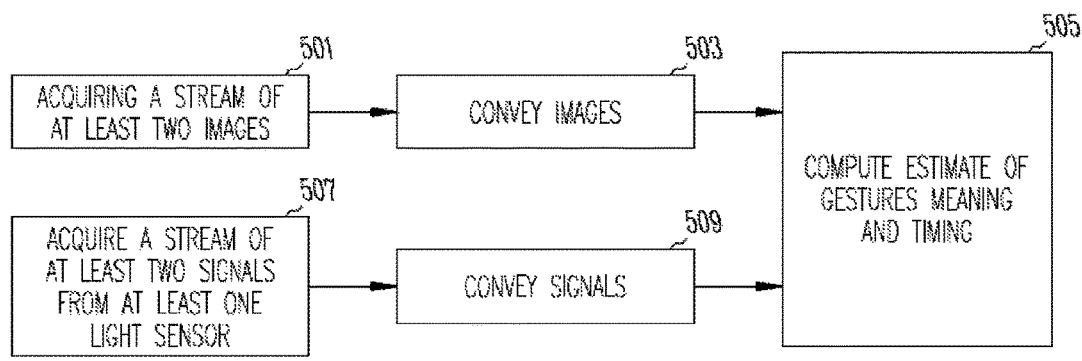
FIG. 16 and FIG. 17 show embodiments of methods of gesture recognition.

FIG. 16 shows an embodiment of a method of gesture recognition. The method comprises an operation 501 that includes acquiring a stream in time of at least two images from each of at least one of the camera module(s); and an operation 507 that includes also acquiring a stream, in time, of at least two signals from each of at least one of the light sensors. The method further comprises, at operations 503 and 509, conveying the images and/or signals to a processor. The method further comprises, at operation 505, using the processor, an estimate of a gesture's meaning, and timing, based on the combination of the images and signals.

Figure 17:
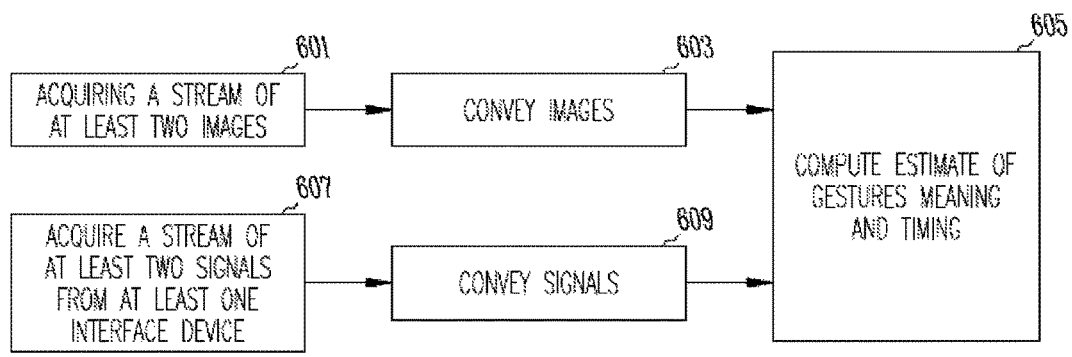

FIG. 17 shows an embodiment of a method of gesture recognition. The method comprises an operation 601 that includes acquiring a stream in time of at least two images from each of at least one of the camera modules; and an operation 607 that includes also acquiring a stream, in time, of at least two signals from each of at least one of the touch-based interface devices. The method further comprises, at operations 603 and 609, conveying the images and/or signals to a processor. The method further comprises, at operation 605, using the processor, an estimate of a gesture's meaning, and timing, based on the combination of the images and signals.

In embodiments, signals received by at least one of (1) the touch-based interface devices; (2) the camera modules; (3) the light sensors, each of these either thin the peripheral and/or the display or display/input regions, may be employed and, singly or jointly, used to determine the presence, and the type, of gesture indicated by a user of the device.

Referring again to FIG. 16, in embodiments, a stream, in time, of images is acquired from each of at least one of the camera modules. A stream, in time, of at least two signals from each of at least one of the light sensors is also acquired. In embodiments, the streams may be acquired from the different classes of peripheral devices synchronously. In embodiments, the streams may be acquired with known time stamps indicating when each was acquired relative to the others, for example, to some conference reference time point. In embodiments, the streams are conveyed to a processor. The processor computes an estimate of the gesture's meaning, and timing, based on the combination of the images and signals.

In embodiments, at least one camera module has a wide field of view exceeding about 40°. In embodiments, at least one camera module employs a fisheye lens. In embodiments, at least one image sensor achieves higher resolution at its center, and lower resolution in its periphery. In embodiments, at least one image sensor uses smaller pixels near its center and larger pixels near its periphery.

In embodiments, active illumination via at least one light source; combined with partial reflection and/or partial scattering off of a proximate object; combined with light sensing using at least one optical module or light sensor; may be combined to detect proximity to an object. In embodiments, information regarding such proximity may be used to reduce power consumption of the device. In embodiments, power consumption may be reduced by dimming, or turning off, power-consuming components such as a display.

In embodiments, at least one optical source may emit infrared light. In embodiments, at least one optical source may emit infrared light in the near infrared between about 700 nm and about 1100 nm. In embodiments, at least one optical source may emit infrared light in the short-wavelength infrared between about 1100 nm and about 1700 nm wavelength. In embodiments, the light emitted by the optical source is substantially not visible to the user of the device.

In embodiments, at least one optical source may project a structured light image. In embodiments, spatial patterned illumination, combined with imaging, may be employed to estimate the relative distance of objects relative to the imaging system.

In embodiments, at least two lensing systems may be employed to image a scene, or portions of a scene, onto two distinct regions of a monolithically-integrated single image sensor integrated circuit; and the patterns of light thus acquired using the image sensor integrated circuit may be used to aid in estimating the relative or absolute distances of objects relative to the image sensor system.

In embodiments, at least two lensing systems may be employed to image a scene, or portions of a scene, onto two distinct image sensor integrated circuits housed within a single camera system; and the patterns of light thus acquired using the image sensor integrated circuits may be used to aid in estimating the relative or absolute distances of objects relative to the image sensor system.

In embodiments, at least two lensing systems may be employed to image a scene, or portions of a scene, onto two distinct image sensor integrated circuits housed within separate camera systems or subsystems; and the patterns of light thus acquired using the image sensor integrated circuits may be used to aid in estimating the relative or absolute distances of objects relative to the image sensor systems or subsystems.

In embodiments, the different angles of regard, or perspectives, from which the at least two optical systems perceive the scene, may be used to aid in estimating the relative or absolute distances of objects relative to the image sensor system.

In embodiments, light sensors such as the light sensors 115A, 115B situated in the peripheral region 101 of FIG. 12, and/or the light sensors 107A, 107B situated in the display region 103 of FIG. 12, may be used singly, or in combination with one another, and/or in combination with camera modules, to acquire information about a scene. In embodiments, light sensors may employ lenses to aid in directing light from certain regions of a scene onto specific light sensors. In embodiments, light sensors may employ systems for aperturing, such as light-blocking housings, that define a limited angular range over which light from a scene will impinge on a certain light sensor. In embodiments, a specific light sensor will, with the aid of aperturing, be responsible for sensing light from within a specific angular cone of incidence.

In embodiments, the different angles of regard, or perspectives, from which the at least two optical systems perceive the scene, may be used to aid in estimating the relative or absolute distances of objects relative to the image sensor system.

In embodiments, the time sequence of light detector from at least two light sensors may be used to estimate the direction and velocity of an object. In embodiments, the time sequence of light detector from at least two light sensors may be used to ascertain that a gesture was made by a user of a computing device. In embodiments, the time sequence of light detector from at least two light sensors may be used to classify the gesture that was made by a user of a computing device. In embodiments, information regarding the classification of a gesture, as well as the estimated occurrence in time of the classified gesture, may be conveyed to other systems or subsystems within a computing device, including to a processing unit.

In embodiments, light sensors may be integrated into the display region of a computing device, for example, the light sensors 107A, 107B of FIG. 12. In embodiments, the incorporation of the light sensors into the display region can be achieved without the operation of the display in the conveyance of visual information to the user being substantially altered. In embodiments, the display may convey visual information to the user principally using visible wavelengths in the range of about 400 nm to about 650 nm, while the light sensors may acquire visual information regarding the scene principally using infrared light of wavelengths longer than about 650 nm. In embodiments, a 'display plane' operating principally in the visible wavelength region may reside in front of—closer to the user—than a 'light sensing plane' that may operate principally in the infrared spectral region.

In embodiments, structured light of a first type may be employed, and of a second type may also be employed, and the information from the at least two structured light illuminations may be usefully combined to ascertain information regarding a scene that exceeds the information contained in either isolated structured light image.

In embodiments, structured light of a first type may be employed to illuminate a scene and may be presented from a first source providing a first angle of illumination; and structured light of a second type may be employed to illuminate a scene and may be presented from a second source providing a second angle of illumination.

In embodiments, structured light of a first type and a first angle of illumination may be sensed using a first image sensor providing a first angle of sensing; and also using a second image sensor providing a second angle of sensing.

In embodiments, structured light having a first pattern may be presented from a first source; and structured light having a second pattern may be presented from a second source.

In embodiments, structured light having a first pattern may be presented from a source during a first time period; and structured light having a second pattern may be presented from a source during a second time period.

In embodiments, structured light of a first wavelength may be used to illuminate a scene from a first source having a first angle of illumination; and structured light of a second wavelength may be used to illuminate a scene from a second source having a second angle of illumination.

In embodiments, structured light of a first wavelength may be used to illuminate a scene using a first pattern; and structured light of a second wavelength may be used to illuminate a scene using a second pattern. In embodiments, a first image sensor may sense the scene with a strong response at the first wavelength and a weak response at the second wavelength; and a second image sensor may sense the scene with a strong response at the second wavelength and a weak response at the first wavelength. In embodiments, an image sensor may consist of a first class of pixels having strong response at the first wavelength and weak response at the second wavelength; and of a second class of pixels having strong response at the second wavelength and weak response at the first wavelength.

Embodiments include image sensor systems that employ a filter having a first bandpass spectral region; a first bandblock spectral region; and a second bandpass spectral region. Embodiments include the first bandpass region corresponding to the visible spectral region; the first bandblock spectral region corresponding to a first portion of the infrared; and the second bandpass spectral region corresponding to a second portion of the infrared. Embodiments include using a first time period to detect primarily the visible-wavelength scene; and using active illumination within the second bandpass region during a second time period to detect the sum of a visible-wavelength scene and an actively-illuminated infrared scene; and using the difference between images acquired during the two time periods to infer a primarily actively-illuminated infrared scene. Embodiments include using structured light during the second time period. Embodiments include using infrared structured light. Embodiments include using the structured light images to infer depth information regarding the scene; and in tagging, or manipulating, the visible images using information regarding depth acquired based on the structured light images.

In embodiments, gestures inferred may include one-thumb-up; two-thumbs-up; a finger swipe; a two-finger swipe; a three-finger swipe; a four-finger-swipe; a thumb plus one finger swipe; a thumb plus two finger swipe; etc. In embodiments, gestures inferred may include movement of a first digit in a first direction; and of a second digit in a substantially opposite direction. Gestures inferred may include a tickle.

Sensing of the intensity of light incident on an object may be employed in a number of applications. One such application includes estimation of ambient light levels incident upon an object so that the object's own light-emission intensity can be suitable selected. In mobile devices such as cell phones, personal digital assistants, smart phones, and the like, the battery life, and thus the reduction of the consumption of power, are of importance. At the same time, the visual display of information, such as through the use of a display such as those based on LCDs or pixellated LEDs, may also be needed. The intensity with which this visual information is displayed depends at least partially on the ambient illumination of the scene. For example, in very bright ambient lighting, more light intensity generally needs to be emitted by the display in order for the display's visual impression or image to be clearly visible above the background light level. When ambient lighting is weaker, it is feasible to consume less battery power by emitting a lower level of light from the display.

As a result, it is of interest to sense the light level near or in the display region. Existing methods of light sensing often include a single, or a very few, light sensors, often of small area. This can lead to undesired anomalies and errors in the estimation of ambient illumination levels, especially when the ambient illumination of the device of interest is spatially inhomogeneous. For example, shadows due to obscuring or partially obscuring objects may—if they obscure one or a few sensing elements—result in a display intensity that is less bright than desirable under the true average lighting conditions.

Embodiments include realization of a sensor, or sensors, that accurately permit the determination of light levels. Embodiments include at least one sensor realized using solution-processed light-absorbing materials. Embodiments include sensors in which colloidal quantum dot films constitute the primary light-absorbing element. Embodiments include systems for the conveyance of signals relating to the light level impinging on the sensor that reduce, or mitigate, the presence of noise in the signal as it travels over a distance between a passive sensor and active electronics that employ the modulation of electrical signals used in transduction. Embodiments include systems that include (1) the light-absorbing sensing element; (2) electrical interconnect for the conveyance of signals relating to the light intensity impinging upon the sensing element; and (3) circuitry that is remote from the light-absorbing sensing element, and is connected to it via the electrical interconnect, that achieves low-noise conveyance of the sensed signal through the electrical interconnect. Embodiments include systems in which the length of interconnect is more than one centimeter in length. Embodiments include systems in which interconnect does not require special shielding yet achieve practically useful signal-to-noise levels.

Embodiments include sensors, or sensor systems, that are employed, singly or in combination, to estimate the average color temperature illuminating the display region of a computing device. Embodiments include sensors, or sensor systems, that accept light from a wide angular range, such as greater than about ±20° to normal incidence, or greater than about ±30° to normal incidence, or greater than about ±40° to normal incidence. Embodiments include sensors, or sensor systems, that include at least two types of optical filters, a first type passing primarily a first spectral band, a second type passing primarily a second spectral band. Embodiments include using information from at least two sensors employing at least two types of optical filters to estimate color temperature illuminating the display region, or a region proximate the display region.

Embodiments include systems employing at least two types of sensors. Embodiments include a first type constituted of a first light-sensing material, and a second type constituted of a second light-sensing material. Embodiments include a first light-sensing material configured to absorb, and transduce, light in a first spectral band, and a second light-sensing material configured to transduce a second spectral band. Embodiments include a first light-sensing material employing a plurality of nanoparticles having a first average diameter, and a second light-sensing material employing a plurality of nanoparticles have a second average diameter. Embodiments include a first diameter in the range of approximately 1 nm to approximately 2 nm, and a second diameter greater than about 2 nm.

Embodiments include methods of incorporating a light-sensing material into, or onto, a computing device involving ink-jet printing. Embodiments include using a nozzle to apply light-sensing material over a defined region. Embodiments include defining a primary light-sensing region using electrodes. Embodiments include methods of fabricating light sensing devices integrated into, or onto, a computing device involving: defining a first electrode; defining a second electrode; defining a light-sensing region in electrical communication with the first and the second electrode. Embodiments include methods of fabricating light sensing devices integrated into, or onto, a computing device involving: defining a first electrode; defining a light-sensing region; and defining a second electrode; where the light sensing region is in electrical communication with the first and the second electrode.

Embodiments include integration at least two types of sensors into, or onto, a computing device, using ink-jet printing. Embodiments include using a first reservoir containing a first light-sensing material configured to absorb, and transduce, light in a first spectral band; and using a second reservoir containing a second light-sensing material configured to absorb, and transduce, light in a second spectral band.

Embodiments include the use of differential or modulated signaling in order to substantially suppress any external interference. Embodiments include subtracting dark background noise.

Figure 18:
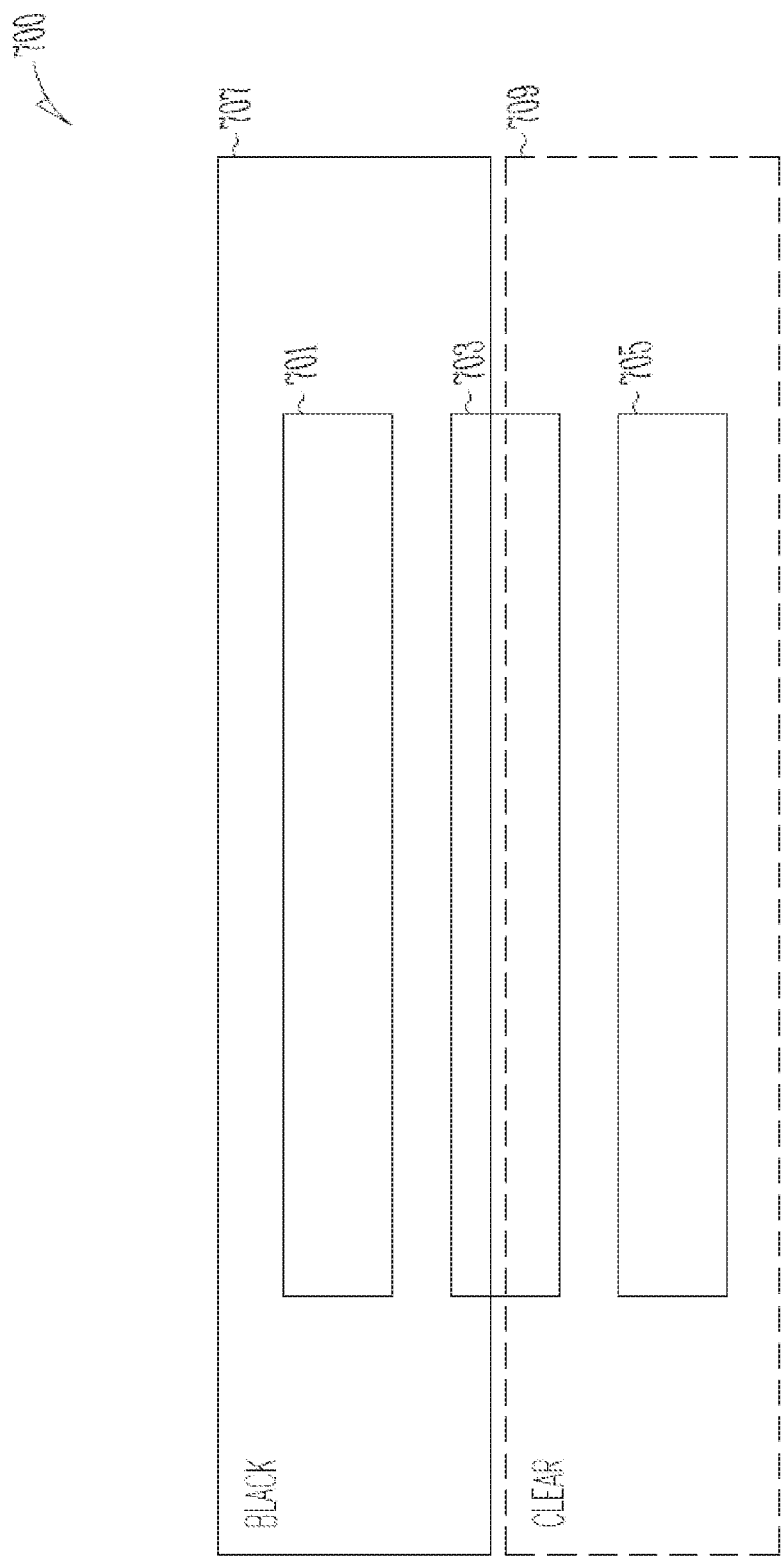
FIG. 18 shows an embodiment of a three-electrode differential-layout system to reduce external interferences with light sensing operations.

Embodiments include a differential system depicted in FIG. 18. FIG. 18 shows an embodiment of a three-electrode differential-layout system 700 to reduce external interferences with light sensing operations. The three-electrode differential-layout system 700 is shown to include a light sensing material covering all three electrodes 701, 703, 705. A light-obscuring material 707 (Black) prevents light from impinging upon the light-sensing material in a region that is electrically accessed using the first electrode 701 and the second electrode 703. A substantially transparent material 709 (Clear) allows light to impinge upon the light-sensing material in a substantially distinct region that is electrically accessed using the second electrode 703 and the third electrode 705. The difference in the current flowing through the Clear-covered electrode pair and the Black-covered electrode pair is equal to the photocurrent—that is, this difference does not include any dark current, but instead is proportional to the light intensity, with any dark offset substantially removed.

Embodiments include the use of a three-electrode system as follows. Each electrode consists of a metal wire. Light-absorbing material may be in electrical communication with the metal wires. Embodiments include the encapsulation of the light-absorbing material using a substantially transparent material that protects the light-absorbing material from ambient environmental conditions such as air, water, humidity, dust, and dirt. The middle of the three electrodes may be biased to a voltage $V_1$, where an example of a typical voltage is about 0 V. The two outer electrodes may be biased to a voltage $V_2$, where a typical value is about 3 V. Embodiments include covering a portion of the device using light-obscuring material that substantially prevents, or reduces, the incidence of light on the light-sensing material.

The light-obscuring material ensures that one pair of electrodes sees little or no light. This pair is termed the dark, or reference, electrode pair. The use of a transparent material over the other electrode pair ensures that, if light is incident, it is substantially incident upon the fight-sensing material. This pair is termed the light electrode pair.

The difference in the current flowing through the light electrode pair and the dark electrode pair is equal to the photocurrent—that is, this difference does not include any dark current, but instead is proportional to the light intensity, with any dark offset substantially removed.

Figure 19:
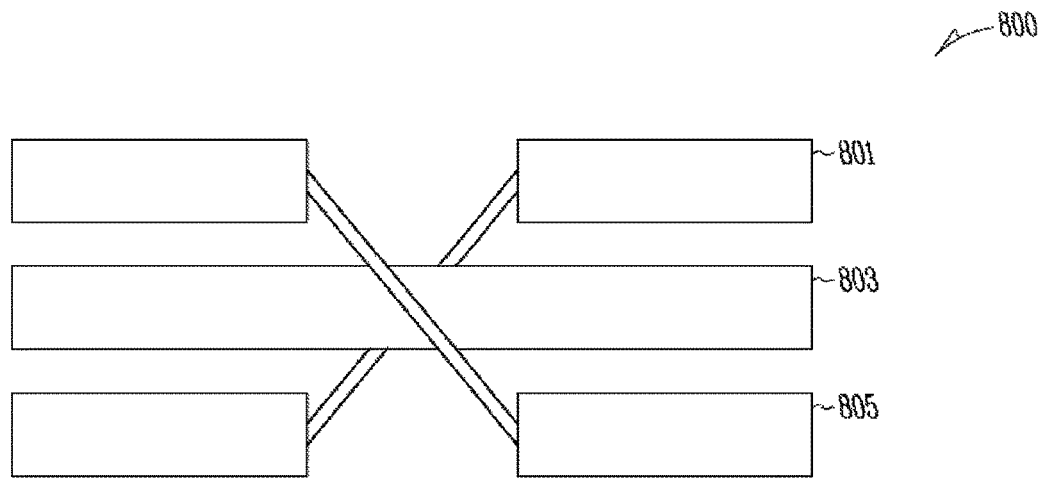
FIG. 19 shows an embodiment of a three-electrode twisted-pair layout system to reduce common-mode noise from external interferences in light sensing operations.

In embodiments, these electrodes are wired in twisted-pair form. In this manner, common-mode noise from external sources is reduced or mitigated. Referring to FIG. 19, electrodes 801, 803, 805 with twisted pair layout 800, the use of a planar analogue of a twisted-pair configuration leads to reduction or mitigation of common-mode noise from external sources.

In another embodiment, biasing may be used such that the light-obscuring layer may not be required. The three electrodes may be biased to three voltages $V_1$, $V_2$, and $V_3$. In one example, $V_1=6$ V, $V_2=3$ V, $V_3=0$ V. The light sensor between 6 V and 3 V, and that between 0 V and 3 V, will generate opposite-direction currents when read between the 6 V and 0 V. The resultant differential signal is then transferred out in twisted-pair fashion.

In embodiments, the electrode layout may itself be twisted, further improving the noise-resistance inside the sensor. In this case, an architecture is used in which an electrode may cross over another.

Figure 20:
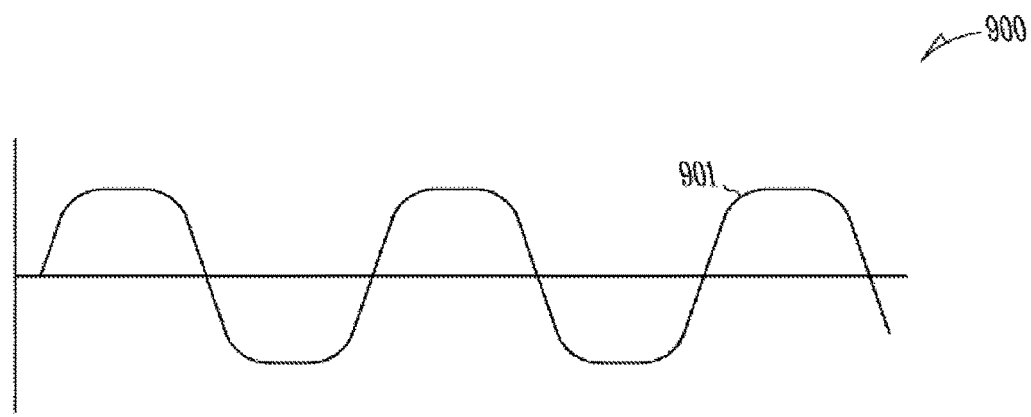
FIG. 20 is an embodiment of time-modulated biasing a signal applied to electrodes to reduce external noise that is not at the modulation frequency.

In embodiments, electrical bias modulation may be employed. An alternating bias may be used between a pair of electrodes. The photocurrent that flows will substantially mimic the temporal evolution of the time-varying electrical biasing. Readout strategies include filtering to generate a low-noise electrical signal. The temporal variations in the biasing include sinusoidal, square, or other periodic profiles. For example, referring to FIG. 20, an embodiment of time-modulated biasing 900 a signal 901 applied to electrodes to reduce external noise that is not at the modulation frequency. Modulating the signal in time allows rejection of external noise that is not at the modulation frequency.

Embodiments include combining the differential layout strategy with the modulation strategy to achieve further improvements in signal-to-noise levels.

Embodiments include employing a number of sensors having different shapes, sizes, and spectral response (e.g., sensitivities to different colors). Embodiments include generating multi-level output signals. Embodiments include processing signals using suitable circuits and algorithms to reconstruct information about the spectral and/or other properties of the light incident.

Advantages of the disclosed subject matter include transfer of accurate information about light intensity over longer distances than would otherwise be possible. Advantages include detection of lower levels of light as a result. Advantages include sensing a wider range of possible light levels. Advantages include successful light intensity determination over a wider range of temperatures, an advantage especially conferred when the dark reference is subtracted using the differential methods described herein.

Embodiments include a light sensor including a first electrode, a second electrode, and a third electrode. A light-absorbing semiconductor is in electrical communication with each of the first, second, and third electrodes. A light-obscuring material substantially attenuates the incidence of light onto the portion of light-absorbing semiconductor residing between the second and the third electrodes, where an electrical bias is applied between the second electrode and the first and third electrodes and where the current flowing through the second electrode is related to the light incident on the sensor.

Embodiments include a light sensor including a first electrode, a second electrode, and a light-absorbing semiconductor in electrical communication with the electrodes wherein a time-varying electrical bias is applied between the first and second electrodes and wherein the current flowing between the electrodes is filtered according to the time-varying electrical bias profile, wherein the resultant component of current is related to the light incident on the sensor.

Embodiments include the above embodiments where the first, second, and third electrodes consists of a material chosen from the list: gold, platinum, palladium, silver, magnesium, manganese, tungsten, titanium, titanium nitride, titanium dioxide, titanium oxynitride, aluminum, calcium, and lead.

Embodiments include the above embodiments where the light-absorbing semiconductor includes materials taken from the list: PbS, PbSe, PbTe, SnS, SnSe, SnTe, CdS, CdSe, CdTe, Bi2S3, In2S3, In2S3, In2Te3, ZnS, ZnSe, ZnTe, Si, Ge, GaAs, polypyrolle, pentacene, polyphenylenevinylene, polyhexylthiophene, and phenyl-C61-butyric acid methyl ester.

Embodiments include the above embodiments where the bias voltages are greater than about 0.1 V and less than about 10 V. Embodiments include the above embodiments where the electrodes are spaced a distance between about 1 μm and about 20 μm from one another.

Embodiments include the above embodiments where the distance between the light-sensing region and active circuitry used in biasing and reading is greater than about 1 cm and less than about 30 cm.

The capture of visual information regarding a scene, such as via imaging, is desired in a range of areas of application. In cases, the optical properties of the medium residing between the imaging system, and the scene of interest, may exhibit optical absorption, optical scattering, or both. In cases, the optical absorption and/or optical scattering may occur more strongly in a first spectral range compared to a second spectral range. In cases, the strongly-absorbing-or-scattering first spectral range may include some or all of the visible spectral range of approximately 470 nm to approximately 630 nm, and the more-weakly-absorbing-or-scattering second spectral range may include portions of the infrared spanning a range of approximately 650 nm to approximately 24 μm wavelengths.

In embodiments, image quality may be augmented by providing an image sensor array having sensitivity to wavelengths longer than about a 650 nm wavelength.

In embodiments, an imaging system may operate in two modes: a first mode for visible-wavelength imaging; and a second mode for infrared imaging. In embodiments, the first mode may employ a filter that substantially blocks the incidence of light of some infrared wavelengths onto the image sensor.

Figure 21:
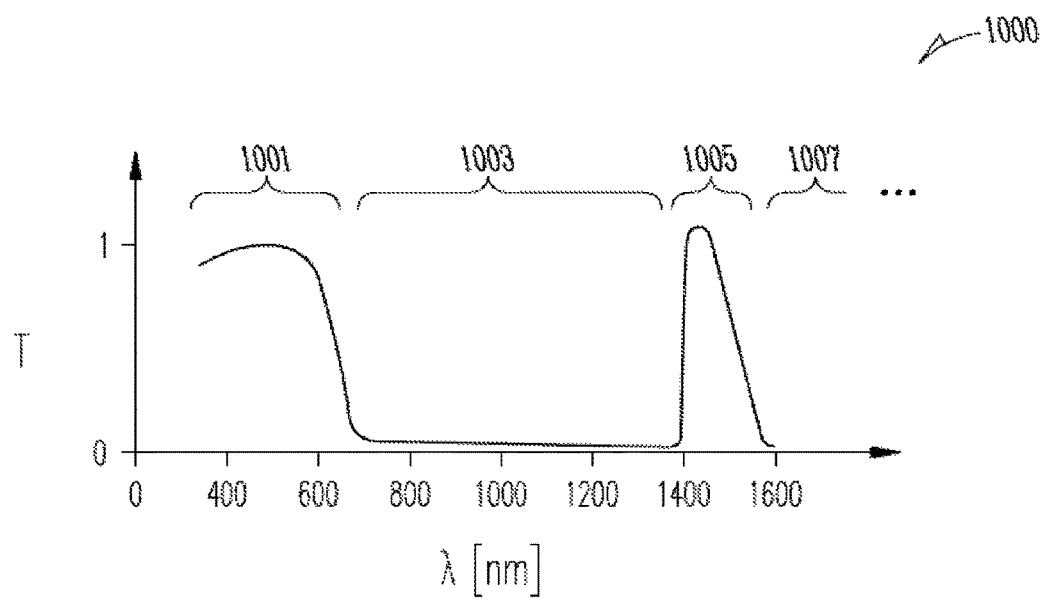
FIG. 21 shows an embodiment of a transmittance spectrum of a filter that may be used in various imaging applications.

Referring now to FIG. 21, an embodiment of a transmittance spectrum 1000 of a filter that may be used in various imaging applications. Wavelengths in the visible spectral region 1001 are substantially transmitted, enabling visible-wavelength imaging. Wavelengths in the infrared bands 1003 of approximately 750 nm to approximately 1450 nm, and also in a region 1007 beyond about 1600 nm, are substantially blocked, reducing the effect of images associated with ambient infrared lighting. Wavelengths in the infrared band 1005 of approximately 1450 nm to approximately 1600 nm are substantially transmitted, enabling infrared-wavelength imaging when an active source having its principal spectral power within this band is turned on.

In embodiments, an imaging system may operate in two modes: a first mode for visible-wavelength imaging; and a second mode for infrared imaging. In embodiments, the system may employ an optical filter, which remains in place in each of the two modes, that substantially blocks incidence of light over a first infrared spectral band; and that substantially passes incidence of light over a second infrared spectral band. In embodiments, the first infrared spectral band that is blocked may span from about 700 nm to about 1450 nm. In embodiments, the second infrared spectral band that is substantially not blocked may begin at about 1450 nm. In embodiments, the second infrared spectral band that is substantially not blocked may end at about 1600 nm. In embodiments, in the second mode for infrared imaging, active illuminating that includes power in the second infrared spectral band that is substantially not blocked may be employed. In embodiments, a substantially visible-wavelength image may be acquired via image capture in the first mode. In embodiments, a substantially actively-infrared-illuminated image may be acquired via image capture in the second mode. In embodiments, a substantially actively-infrared-illuminated image may be acquired via image capture in the second mode aided by the subtraction of an image acquired during the first mode. In embodiments, a periodic-in-time alternation between the first mode and second mode may be employed. In embodiments, a periodic-in-time alternation between no-infrared-illumination, and active-infrared-illumination, may be employed. In embodiments, a periodic-in-time alternation between reporting a substantially visible-wavelength image, and reporting a substantially actively-illuminated-infrared image, may be employed. In embodiments, a composite image may be generated which displays, in overlaid fashion, information relating to the visible-wavelength image and the infrared-wavelength image. In embodiments, a composite image may be generated which uses a first visible-wavelength color, such as blue, to represent the visible-wavelength image; and uses a second visible-wavelength color, such as red, to represent the actively-illuminated infrared-wavelength image, in a manner that is overlaid.

In image sensors, a nonzero, nonuniform, image may be present even in the absence of illumination, (in the dark). If not accounted for, the dark images can lead to distortion and noise in the presentation of illuminated images.

In embodiments, an image may be acquired that represents the signal present in the dark. In embodiments, an image may be presented at the output of an imaging system that represents the difference between an illuminated image and the dark image. In embodiments, the dark image may be acquired by using electrical biasing to reduce the sensitivity of the image sensor to light. In embodiments, an image sensor system may employ a first time interval, with a first biasing scheme, to acquire a substantially dark image; and a second time interval, with a second biasing scheme, to acquire a light image. In embodiments, the image sensor system may store the substantially dark image in memory; and may use the stored substantially dark image in presenting an image that represents the difference between a light image and a substantially dark image. Embodiments include reducing distortion, and reducing noise, using the method.

In embodiments, a first image may be acquired that represents the signal present following reset; and a second image may be acquired that represents the signal present following an integration time; and an image may be presented that represents the difference between the two images. In embodiments, memory may be employed to store at least one of two of the input images. In embodiments, the result difference image may provide temporal noise characteristics that are consistent with correlated double-sampling noise. In embodiments, an image may be presented having equivalent temporal noise considerable less than that imposed by sqrt(kTC) noise.

Embodiments include high-speed readout of a dark image; and of a light image; and high-speed access to memory and high-speed image processing; to present a dark-subtracted image to a user rapidly.

Embodiments include a camera system in which the interval between the user indicating that an image is to be acquired; and in which the integration period associated with the acquisition of the image; is less than about one second. Embodiments include a camera system that includes a memory element in between the image sensor and the processor.

Embodiments include a camera system in which the time in between shots is less than about one second.

Embodiments include a camera system in which a first image is acquired and stored in memory; and a second image is acquired; and a processor is used to generate an image that employs information from the first image and the second image. Embodiments include generating an image with high dynamic range by combining information from the first image and the second image. Embodiments include a first image having a first focus; and a second image having a second focus; and generating an image from the first image and the second image having higher equivalent depth of focus.

Hotter objects generally emit higher spectral power density at shorter wavelengths than do colder objects. Information may thus be extracted regarding the relative temperatures of objects imaged in a scene based on the ratios of power in a first band to the power in a second band.

In embodiments, an image sensor may comprise a first set of pixels configured to sense light primarily within a first spectral band; and a second set of pixels configured to sense light primarily within a second spectral band. In embodiments, an inferred image may be reported that combines information from proximate pixels of the first and second sets. In embodiments, an inferred image may be reported that provides the ratio of signals from proximate pixels of the first and second sets.

In embodiments, an image sensor may include a means of estimating object temperature; and may further include a means of acquiring visible-wavelength images. In embodiments, image processing may be used to false-color an image representing estimated relative object temperature atop a visible-wavelength image.

In embodiments, the image sensor may include at least one pixel having linear dimensions less than approximately 2 µm×2 µm.

In embodiments, the image sensor may include a first layer providing sensing in a first spectral band; and a second layer providing sensing in a second spectral band.

In embodiments, visible images can be used to present a familiar representation to users of a scene; and infrared images can provide added information, such as regarding temperature, or pigment, or enable penetration through scattering and/or visible-absorbing media such as fog, haze, smoke, or fabrics.

In cases, it may be desired to acquire both visible and infrared images using a single image sensor. In cases, registration among visible and infrared images is thus rendered substantially straightforward.

In embodiments, an image sensor may employ a single class of light-absorbing light-sensing material; and may employ a patterned layer above it that is responsible for spectrally-selective transmission of light through it, also known as a filter. In embodiments, the light-absorbing light-sensing material may provide high-quantum-efficiency light sensing over both the visible and at least a portion of the infrared spectral regions. In embodiments, the patterned layer may enable both visible-wavelength pixel regions, and also infrared-wavelength pixel regions, on a single image sensor circuit.

In embodiments, an image sensor may employ two classes of light-absorbing light-sensing materials: a first material configured to absorb and sense a first range of wavelengths; and a second material configured to absorb and sense a second range of wavelengths. The first and second ranges may be at least partially overlapping, or they may not be overlapping.

In embodiments, two classes of light-absorbing light-sensing materials may be placed in different regions of the image sensor. In embodiments, lithography and etching may be employed to define which regions are covered using which light-absorbing light-sensing materials. In embodiments, ink-jet printing may be employed to define which regions are covered using which light-absorbing light-sensing materials.

In embodiments, two classes of light-absorbing light-sensing materials may be stacked vertically atop one another. In embodiments, a bottom layer may sense both infrared and visible light; and a top layer may sense visible light principally.

In embodiments, an optically-sensitive device may include: a first electrode; a first light-absorbing light-sensing material; a second light-absorbing light-sensing material; and a second electrode. In embodiments, a first electrical bias may be provided between the first and second electrodes such that photocarriers are efficiently collected primarily from the first light-absorbing light-sensing material. In embodiments, a second electrical bias may be provided between the first and second electrodes such that photocarriers are efficiently collected primarily from the second light-absorbing light-sensing material. In embodiments, the first electrical bias may result in sensitivity primarily to a first wavelength of light. In embodiments, the second electrical bias may result in sensitivity primarily to a second wavelength of light. In embodiments, the first wavelength of light may be infrared; and the second wavelength of light may be visible. In embodiments, a first set of pixels may be provided with the first bias; and a second set of pixels may be provided with the second bias; ensuring that the first set of pixels responds primarily to a first wavelength of light, and the second set of pixels responds primarily to a second wavelength of light.

In embodiments, a first electrical bias may be provided during a first period of time; and a second electrical bias may be provided during a second period of time; such that the image acquired during the first period of time provides information primarily regarding a first wavelength of light; and the image acquired during the second period of time provides information primarily regarding a second wavelength of light. In embodiments, information acquired during the two periods of time may be combined into a single image. In embodiments, false-color may be used to represent, in a single reported image, information acquired during each of the two periods of time.

In embodiments, a focal plane array may consist of a substantially laterally-spatially uniform film having a substantially laterally-uniform spectral response at a given bias; and having a spectral response that depends on the bias. In embodiments, a spatially nonuniform bias may be applied, for example, different pixel regions may bias the film differently. In embodiments, under a given spatially-dependent biasing configuration, different pixels may provide different spectral responses. In embodiments, a first class of pixels may be responsive principally to visible wavelengths of light, while a second class of pixels may be responsive principally to infrared wavelengths of light. In embodiments, a first class of pixels may be responsive principally to one visible-wavelength color, such as blue; and a second class of pixels may be responsive principally to a distinctive visible-wavelength color, such as green; and a third class of pixels may be responsive principally to a distinctive visible-wavelength color, such as red.

In embodiments, an image sensor may comprise a readout integrated circuit, at least one pixel electrode of a first class, at least one pixel electrode of a second class, a first layer of optically sensitive material, and a second layer of optically sensitive material. In embodiments, the image sensor may employ application of a first bias for the first pixel electrode class; and of a second bias to the second pixel electrode class.

In embodiments, those pixel regions corresponding to the first pixel electrode class may exhibit a first spectral response; and of the second pixel electrode class may exhibit a second spectral response; where the first and second spectral responses are significantly different. In embodiments, the first spectral response may be substantially limited to the visible-wavelength region. In embodiments, the second spectral response may be substantially limited to the visible-wavelength region. In embodiments, the second spectral response may include both portions of the visible and portions of the infrared spectral regions.

In embodiments, it may be desired to fabricate an image sensor having high quantum efficiency combined with low dark current.

In embodiments, a device may consist of: a first electrode; a first selective spacer; a light-absorbing material; a second selective spacer; and a second electrode.

In embodiments, the first electrode may be used to extract electrons. In embodiments, the first selective spacer may be used to facilitate the extraction of electrons but block the injection of holes. In embodiments, the first selective spacer may be an electron-transport layer. In embodiments, the light-absorbing material may include semiconductor nanoparticles. In embodiments, the second selective spacer may be used to facilitate the extraction of holes but block the injection of electrons. In embodiments, the second selective spacer may be a hole-transport layer.

In embodiments, only a first selective spacer may be employed. In embodiments, the first selective spacer may be chosen from the list: TiO2, ZnO, ZnS. In embodiments, the second selective spacer may be NiO. In embodiments, the first and second electrode may be made using the same material. In embodiments, the first electrode may be chosen from the list: TiN, W, Al, Cu. In embodiments, the second electrode may be chosen from the list: ZnO, Al:ZnO, ITO, MoO3, Pedot, Pedot:PSS.

In embodiments, it may be desired to implement an image sensor in which the light-sensing element can be configured during a first interval to accumulate photocarriers; and during a second interval to transfer photocarriers to another node in a circuit.

Embodiments include a device comprising: a first electrode; a light sensing material; a blocking layer; and a second electrode.

Embodiments include electrically biasing the device during a first interval, known as the integration period, such that photocarriers are transported towards the first blocking layer; and where photocarriers are stored near the interface with the blocking layer during the integration period.

Embodiments include electrically biasing the device during a second interval, known as the transfer period, such that the stored photocarriers are extracted during the transfer period into another node in a circuit.

Embodiments include a first electrode chosen from the list: TiN, W, Al, Cu. In embodiments, the second electrode may be chosen from the list: ZnO, Al:ZnO, ITO, MoO3, Pedot, Pedot:PSS. In embodiments, the blocking layer be chosen from the list: HfO2, Al2O3, NiO, TiO2, ZnO.

In embodiments, the bias polarity during the integration period may be opposite to that during the transfer period. In embodiments, the bias during the integration period may be of the same polarity as that during the transfer period. In embodiments, the amplitude of the bias during the transfer period may be greater than that during the integration period.

Embodiments include a light sensor in which an optically sensitive material functions as the gate of a silicon transistor. Embodiments include devices comprising: a gate electrode coupled to a transistor; an optically sensitive material; a second electrode. Embodiments include the accumulation of photoelectrons at the interface between the gate electrode and the optically sensitive material. Embodiments include the accumulation of photoelectrons causing the accumulation of holes within the channel of the transistor. Embodiments include a change in the flow of current in the transistor as a result of a change in photoelectrons as a result of illumination. Embodiments include a change in current flow in the transistor greater than 1000 electrons/s for every electron/s of change in the photocurrent flow in the optically sensitive layer. Embodiments include a saturation behavior in which the transistor current versus photons impinged transfer curve has a sublinear dependence on photon fluence, leading to compression and enhanced dynamic range. Embodiments include resetting the charge in the optically sensitive layer by applying a bias to a node on the transistor that results in current flow through the gate during the reset period.

Embodiments include combinations of the above image sensors, camera systems, fabrication methods, algorithms, and computing devices, in which at least one image sensor is capable of operating in global electronic shutter mode.

In embodiments, at least two image sensors, or image sensor regions, may each operate in global shutter mode, and may provide substantially synchronous acquisition of images of distinct wavelengths, or from different angles, or employing different structured light.

Figure 22:
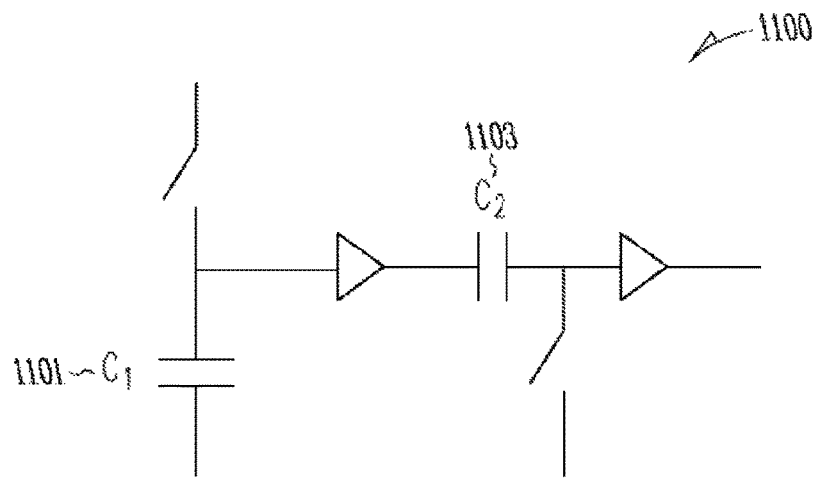
FIG. 22 shows an example schematic diagram of a circuit that may be employed within each pixel to reduce noise power.

Embodiments include implementing correlated double-sampling in the analog domain. Embodiments include so doing using circuitry contained, within each pixel. FIG. 22 shows an example schematic diagram of a circuit 1100 that may be employed within each pixel to reduce noise power. In embodiments, a first capacitor 1101 ($C_1$) and a second capacitor 1103 ($C_2$) are employed in combination as shown. In embodiments, the noise power is reduced according to the ratio $C_2/C_1$.

Figure 23:
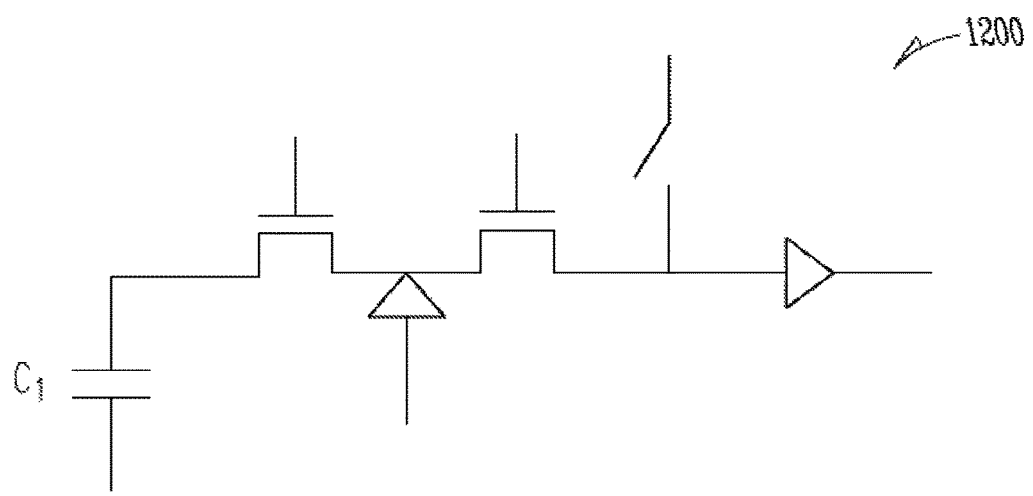
FIG. 23 shows an example schematic diagram of a circuit of a photoGate/pinned-diode storage that may be implemented in silicon.

FIG. 23 shows an example schematic diagram of a circuit 1200 of a photoGate/pinned-diode storage that may be implemented in silicon. In embodiments, the photoGate/pinned-diode storage in silicon is implemented as shown. In embodiments, the storage pinned diode is fully depleted during reset. In embodiments, $C_1$ (corresponding to the light sensor's capacitance, such as quantum dot film in embodiments) sees a constant bias.

In embodiments, light sensing may be enabled through the use of a light sensing material that is integrated with, and read using, a readout integrated circuit. Example embodiments of same are included in U.S. Provisional Application No. 61/352,409, entitled, "Stable, Sensitive Photodetectors and Image Sensors Made Therefrom Including Circuits for Enhanced Image Performance," and U.S. Provisional Application No. 61/352,410, entitled, "Stable, Sensitive Photodetectors and Image Sensors Made Therefrom Including Processes and Materials for Enhanced Image Performance," both filed Jun. 8, 2010, which are hereby incorporated by reference in their entirety.

In embodiments, a method of gesture recognition is provided where the method includes acquiring a stream, in time, of at least two images from each of at least one camera module; acquiring a stream, in time, of at least two signals from each of at least one light sensor; and conveying the at least two images and the at least two signals to a processor, the processor being configured to generate an estimate of a gesture's meaning, and timing, based on a combination of the at least two images and the at least two signals.

In embodiments, the at least one light sensor includes a light-absorbing material having an absorbance, across the visible wavelength region of about 450 nm to about 650 nm, of less than about 30%.

In embodiments, the light-absorbing material includes PBDTT-DPP, the near-infrared light-sensitive polymer poly (2,60-4,8-bis(5-ethylhexylthienyl)benzo-[1,2-b;3,4-b]dithiophene-alt-5-dibutyloctyl-3,6-bis(5-bromothiophen-2-yl) pyrrolo[3,4-c]pyrrole-1,4-dione).

In embodiments, the at least one light sensor includes a light-sensing material capable of sensing infrared light.

In embodiments, the method includes modulating a light source using at least one code selected from spatial codes and temporal codes.

In embodiments, the light source has an emission wave in the range of about 900 nm to about 1000 nm.

In one embodiment, a camera system includes a central imaging array region, at least one light-sensing region outside of the central imaging array region, a first mode, referred to as imaging mode, and a second mode, referred to as sensing mode. The electrical power consumed in the second mode is at least 10 times lower than the electrical power consumed in the first mode.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In one embodiment, an image sensor circuit includes a central imaging array region having a first field of view; and at least one light-sensing region outside of the central imaging array region having a second field of view. The second field of view is less than half, measured in angle, the field of view of the first field of view.

In one embodiment, an integrated circuit includes a substrate, an image sensing array region occupying a first region of said semiconductor substrate and including a plurality of optically sensitive pixel regions, a pixel circuit for each pixel region, each pixel circuit comprising a charge store and a read-out circuit, and a light-sensitive region outside of the image sensing array region. The image sensing array region having a first field of view and the light-sensitive region having a second field of view; the angle of the second field of view is less than half of the angle of the first field of view.

In embodiments, at least one of the image sensing array and the light-sensitive region outside of the image sensing array region includes a light-sensing material capable of sensing infrared light.

In embodiments, light impinging on at least one of the image sensing array and the light-sensitive region outside of the image sensing array region is to be modulated.

In embodiments, a portion of light impinging on at least one of the image sensing array and the light-sensitive region outside of the image sensing array region is to be generated using a light emitter device having an emission wavelength in the range of about 800 nm to about 1000 nm.

In embodiments, the image sensing array includes at least six megapixels.

In embodiments, the image sensing array comprises pixels less than approximately 2 µm in width and approximately 2 µm in height.

In one embodiment, an image sensor includes a central imaging array region to provide pixelated sensing of an image, in communication with a peripheral region that includes circuitry to provide biasing, readout, analog-to-digital conversion, and signal conditioning to the pixelated light sensing region. An optically sensitive material overlies the peripheral region.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In embodiments, the optically sensitive material is chosen to include at least one material from a list, the list including silicon, colloidal quantum dot film, and a semiconducting polymer.

In embodiments, the optically sensitive material is fabricated on a first substrate, and is subsequently incorporated onto the central imaging array region.

In one embodiment, a mobile computing device includes a semiconductor substrate, an image sensor comprising pixel circuitry formed on the semiconductor substrate and an image sensing region, a photosensor comprising read-out circuitry formed on the semiconductor substrate and a light sensitive region, circuitry configured to read an image from the image sensor, a processor configured to process a signal read from the photosensor proportional to an optical signal sensed by the photosensor, and control circuitry configured in at least one mode to provide power to read the photosensor without providing power to read-out the image sensor such that power consumption is reduced compared to a mode where the power is provided to operate the image sensor.

In various ones of the embodiments discussed herein, additional embodiments include the semiconductor substrate comprising a die of silicon. In embodiments, the semiconductor substrate comprises a single die of silicon. In embodiments, the semiconductor substrate comprises an integrated circuit. In embodiments, each pixel circuit comprises circuitry formed on the semiconductor substrate. In embodiments, the read-out circuit for the light-sensitive region comprises circuitry formed on the semiconductor substrate. In embodiments, the image sensing region and the light-sensitive region are formed on the semiconductor substrate. In embodiments, the image sensing region and the light-sensitive region are formed on the single die of silicon. In embodiments, the image sensing region and the light-sensitive region each comprise a layer of photosensitive material on the semiconductor substrate. In embodiments, the control circuitry is formed on the semiconductor substrate. In embodiments, the control circuitry is formed on the semiconductor substrate.

In various ones of the embodiments discussed herein, additional embodiments include the electrical power consumed by the control circuitry and the photosensor during the second mode is at least 100 times lower than electrical power consumed by the control circuitry and the image sensor during the first mode. In embodiments, electrical power consumed to operate the photosensor is at least ten (10) times lower than electrical power consumed to operate the image sensor. In embodiments, electrical power consumed to operate the photosensor is at least fifty (50) times lower than electrical power consumed to operate the image sensor. In embodiments, electrical power consumed to operate the photosensor is at least one hundred (100) times lower than electrical power consumed to operate the image sensor. In embodiments, electrical power consumed to operate the photosensor is less than about 1 milliwatt (mW). In embodiments, electrical power consumed to operate the photosensor is less than about 10 milliwatt (mW).

In various ones of the embodiments discussed herein, additional embodiments include the photosensor is configured to sense light in at least one mode of operation without providing power to the image sensor. In embodiments, a read-out circuit for the photosensor operates independently from the power provided to the semiconductor substrate. In embodiments, a read-out circuit for the photosensor separate from the semiconductor substrate is configured to read-out a signal from the photosensor in at least one mode of operation without power being provided to the semiconductor substrate. In embodiments, a read-out circuit for the photosensor is separate from the semiconductor substrate that is configured to read-out a signal from the photosensor in at least one mode of operation without power being provided to the image sensor. In embodiments, a power management unit is provided for the mobile device, the power management unit is separate from the semiconductor substrate and is configured to monitor current from the, for example, photosensor and/or light sensitive region.

In various ones of the embodiments discussed herein, additional embodiments include that the photosensor is passive. In embodiments, the image sensor is active. In embodiments, the semiconductor substrate includes on-chip power routed to the image sensor. In embodiments, the on-chip power on the semiconductor substrate is not routed to the photosensor. In embodiments, the photosensor is operated independently of the on-chip power on the semiconductor substrate.

In various ones of the embodiments discussed herein, additional embodiments include the image sensing region having an area that is at least 10 times greater than an area of the photosensor. In embodiments, the image sensing region has an area greater than 40 mm². In embodiments, the photosensor has an area less than 4 mm². In embodiments, the image sensing region comprises a plurality of pixel regions, with each pixel region is less than about 2 micron (μm) in width and less than about 2 micron (μm) in height. In embodiments, the image sensing region comprises a plurality of pixel regions, with each pixel region has an area less than about 4 micron squared (μ²). In embodiments, the image sensing region comprises more than 2 million pixel regions. In embodiments, the photosensor has an area of photosensitive material coupled to a where the photosensitive region is greater than 1 to 100 micrometers squared (μ²). In embodiments, the photosensor comprises binned pixel regions having a total binned area of at least 100 microns squared (μ²).

In various ones of the embodiments discussed herein, additional embodiments include the image sensing region being in a center region of an image circle. In embodiments, the photosensor is in a peripheral region of an image circle further comprising optics configured to focus light onto the image sensing region on the semiconductor substrate, the image sensing region being positioned substantially near the center of the image circle. In embodiments, the photosensor is positioned in a peripheral region of the image circle. In embodiments, the photosensor is peripheral to the image sensing region. In embodiments, the photosensor is positioned in a peripheral segment of the image circle. In embodiments, the photosensor has a non-rectangular shape.

In various ones of the embodiments discussed herein, additional embodiments include a second photosensor, the second photosensor being positioned in a peripheral region of the image circle. In embodiments, the first and second photosensors are positioned on opposite sides of the image sensing region. In embodiments, the image sensing region is positioned substantially at the center of the image circle such that there are four peripheral regions around the image sensing region. In embodiments, each peripheral region includes at least one photosensor. In embodiments, is the image sensor region is configured to sense visible light, and at least one of the photosensors is configured to sense infrared light In various ones of the embodiments discussed herein, additional embodiments include the image sensing region and light sensing region comprise the same photosensitive material. In embodiments, the first photosensor and second photosensor comprise the same photosensitive material. In embodiments, a filter is positioned to filter light incident on the image sensor region within a predetermined range. In embodiments, an infrared (IR) filter configured to block infrared light impinging on the image sensing region, and to pass infrared light impinging on the photosensor(s). In embodiments, the light incident on the photosensor is selectively filtered relative to the image sensing region. In embodiments, the image sensing region comprises a first photosensitive material and the light sensing region comprises a second photosensitive material. In embodiments, the first photosensitive material has a different sensitivity to wavelength of light than the second photosensitive material. In embodiments, the first photosensitive material has a higher sensitivity to visible light than the second photosensitive material. In embodiments, the second photosensitive material has a higher sensitivity to infrared (IR) light than the first photosensitive material. In embodiments, the photosensor comprises a first photosensitive material and the second photosensor comprises a second photosensitive material. In embodiments, the first photosensitive material has a different sensitivity to wavelength of light than the second photosensitive material. In embodiments, the first photosensitive material has a higher sensitivity to infrared (IR) light than the second photosensitive material. In embodiments, the second photosensitive material has a higher sensitivity to near infrared (NIR) light than the first photosensitive material. In embodiments, the first photosensitive material comprises a layer of nanocrystal material. In embodiments, the photosensitive material of the image sensing region comprises silicon; and the photosensitive material of the photosensor comprises a layer nanocrystal photosensitive material.

In various ones of the embodiments discussed herein, additional embodiments include optics configured to focus light on an image circle covering both the image sensing region and the photosensor. In embodiments, the image sensing region and the photosensor are positioned in the focal plane of the optics. In embodiments, the image sensing region is in a central region of image circle and the photosensor is in a peripheral region of the image circle.

In various ones of the embodiments discussed herein, additional embodiments include the semiconductor substrate having circuitry in the peripheral region wherein the light sensing region is formed over at least some of the circuitry. In embodiments, the circuitry (e.g., in the peripheral region) comprises circuitry formed on the semiconductor substrate outside the area of the image sensing region. In embodiments, at least some of the circuitry is positioned below the photosensor.

In various ones of the embodiments discussed herein, additional embodiments include the read-out circuit comprising circuitry below the image sensing region. In embodiments, the control circuitry and or the read-out circuit are formed on the substrate (e.g., where the substrate may be a semiconductor substrate).

In various ones of the embodiments discussed herein, additional embodiments include providing a bias across the photosensitive material of the image sensing region of approximately 1 to 4 V. In embodiments, the circuitry provides a bias across the photosensitive material of the photosensor of approximately 1 V to 4 V.

In embodiments, the bias to the photosensitive material of the image sensing region can be selectively turned off independently of the bias across the photosensitive material of the photosensor. In embodiments, the photosensor comprises a first electrode and a second electrode, and a bias provided to the first electrode is independent of a bias applied to the second electrode.

In various ones of the embodiments discussed herein, additional embodiments include the read-out circuit for the photosensor comprises circuitry being below the image sensing region. In embodiments, the read-out circuit for the photosensor comprises off-chip circuitry separate from the semiconductor substrate. In embodiments, the read-out circuit for the photosensor comprises a current monitor. In embodiments, the read-out circuit for the photosensor comprises a counter. In embodiments, the read-out circuit for the photosensor comprises a charge pump. In embodiments, the read-out circuit for the photosensor comprises circuitry formed on the semiconductor substrate. In embodiments, the read-out circuit for the photosensor is configured to generate, for example, a signal, a digital number, or a counter signal indicative of light incident on, for example, the photosensor or the light sensing material.

In various ones of the embodiments discussed herein, additional embodiments include the semiconductor substrate including power routed to a photosensor separately from power routed to the image sensor such that power can be provided to the photosensor when the power to the image sensor is turned off.

In various ones of the embodiments discussed herein, additional embodiments include the image sensor comprising a back side illumination (BSI) silicon image sensor. In embodiments, the photosensor comprises pixel regions coupled to a reset gate of a pixel circuit for current collection. In embodiments, the, for example, image sensor or photosensor comprises silicon photodiodes.

In various ones of the embodiments discussed herein, additional embodiments include the image sensing region being configured to have a first field of view and the photosensor being configured to have a second field of view at a different angle than the first field of view. In embodiments, the first photosensor has a first field of view and second photosensor has a second field of view at a different angle than the first field of view. In embodiments, each photosensor has a field of view at a different angle than each other photosensor. In embodiments, the photosensor has a first field of view, and the second photosensor has a second field-of-view.

In various ones of the embodiments discussed herein, additional embodiments include further comprising a light source for illuminating a scene embodiments, the light source is modulated. In embodiments, the photosensor is configured to sense modulated light reflected from the scene. In embodiments, a processor is configured to process a signal from the photosensor indicative of the modulated light reflected from the scene for gesture recognition.

In various ones of the embodiments discussed herein, additional embodiments include a processor configured to process a signal from the photosensor indicative of the modulated light reflected from the scene for gesture recognition. In embodiments, a processor is configured to process a signal from the photosensor from a first field of view indicative of the modulated light reflected from the scene for gesture recognition. In embodiments, a processor is configured to process a signal from each of the photosensors for gesture recognition. In embodiments, the signal from each photosensor is indicative of the modulated light reflected from the scene for a different field of than the other photosensors.

The various illustrations of the procedures and apparatuses are intended to provide a general understanding of the structure of various embodiments and are not intended to provide a complete description of all the elements and features of the apparatuses and methods that might make use of the structures, features, and materials described herein. Based upon a reading and understanding of the disclosed subject matter provided herein, a person of ordinary skill in the art can readily envision other combinations and permutations of the various embodiments. The additional combinations and permutations are all within a scope of the present invention.

The Abstract of the disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A camera system, comprising:
   a central imaging array region;
   at least one light-sensing region outside of the central imaging array region; and
   a lensing system comprising a spectrally-selective filter, which is configured to remove infrared light from the central imaging array region so that the lensing system projects principally visible light onto the central imaging array region, and to allow infrared light to pass outside the central imaging array region so that the lensing system projects infrared light onto the at least one light-sensing region outside of the central imaging array region.

2. The camera system of claim 1, wherein the at least one light-sensing region includes a light-sensing material capable of sensing infrared light.

3. The camera system of claim 1, wherein light impinging on the at least one light-sensing region is modulated.

4. The camera system of claim 1, wherein a portion of light impinging on the light-sensing region is generated using a light emitter device having an emission wavelength in the range of about 800 nm to about 1000 nm.

5. The camera system of claim 1, wherein the central imaging array includes at least six megapixels.

6. The camera system of claim 1, wherein the central imaging array comprises pixels less than approximately 2 µm in width and approximately 2 µm in height.

7. The camera system of claim 1, and comprising a substrate, wherein the central imaging array region and the at least one light-sensing region occupy respective first and second regions of the substrate.

8. The camera system of claim 1, wherein the central imaging array region has a first field of view and the at least one light-sensing region has a second field of view, the angle of the second field of view being less than half of the angle of the first field of view.

9. The camera system of claim 1, and comprising control circuitry configured in at least one mode to provide power to read the at least one light-sensing region without providing power to read out the central imaging array such that power consumption is reduced compared to another mode in which the power is provided to operate the central imaging array.

* * * * *

UNITED STATES PATENT AND TRADEMARK OFFICE
CERTIFICATE OF CORRECTION

PATENT NO. : 10,516,845 B2
APPLICATION NO. : 15/939323
DATED : December 24, 2019
INVENTOR(S) : Edward Hartley Sargent et al.

Page 1 of 1

It is certified that error appears in the above-identified patent and that said Letters Patent is hereby corrected as shown below:

On the Title Page

Item (73) The address of assignee should read Newark, CA (US)

Signed and Sealed this
Tenth Day of November, 2020

Andrei Iancu
*Director of the United States Patent and Trademark Office*